US009478202B2

(12) United States Patent
Mizuhiki

(10) Patent No.: US 9,478,202 B2
(45) Date of Patent: Oct. 25, 2016

(54) SOUND EFFECT DATA GENERATING APPARATUS

(71) Applicant: YAMAHA CORPORATION, Hamamatsu-shi, Shizuoka-ken (JP)

(72) Inventor: Takashi Mizuhiki, Hamamatsu (JP)

(73) Assignee: YAMAHA CORPORATION, Hamamatsu-Shi (JP)

( * ) Notice: Subject to any disclaimer, the term of this patent is extended or adjusted under 35 U.S.C. 154(b) by 54 days.

(21) Appl. No.: 14/518,100

(22) Filed: Oct. 20, 2014

(65) Prior Publication Data

US 2015/0110281 A1 Apr. 23, 2015

(30) Foreign Application Priority Data

Oct. 18, 2013 (JP) ................................ 2013-217287

(51) Int. Cl.

| | |
|---|---|
| ***H04R 29/00*** | (2006.01) |
| ***G10H 1/06*** | (2006.01) |
| ***G10H 1/00*** | (2006.01) |
| *H03G 3/00* | (2006.01) |
| *G10H 7/00* | (2006.01) |

(52) U.S. Cl.

CPC ............. *G10H 1/06* (2013.01); *G10H 1/0091* (2013.01); *G10H 2220/096* (2013.01); *G10H 2220/116* (2013.01); *G10H 2220/161* (2013.01); *G10H 2240/311* (2013.01)

(58) Field of Classification Search

CPC ................ G10H 1/0008; G10H 1/40; G10H 2210/076; G10H 2240/131; G10H 1/368; G10H 2220/096; G10H 7/00; G10H 2240/141; G10H 2220/106; G10H 2240/145; G10H 1/42; G10H 2210/375; G10H 2230/015; G10H 2210/391; G10H 2210/385

USPC ......... 84/609, 649, 612, 615, 600, 653, 652, 84/636, 622, 616, 659, 668, 735; 381/56, 381/58, 61; 700/94

See application file for complete search history.

(56) References Cited

U.S. PATENT DOCUMENTS

2004/0264917 A1* 12/2004 Braun .................... G10H 1/368 386/201
2009/0308231 A1 12/2009 Mizuhiki et al.
2011/0011244 A1* 1/2011 Homburg ............. G10H 1/0066 84/612
2011/0162513 A1* 7/2011 Mizuhiki ................ G10H 1/06 84/622

FOREIGN PATENT DOCUMENTS

JP 2009300892 A 12/2009
JP 2010066655 A 3/2010

* cited by examiner

*Primary Examiner* — Paul S Kim
*Assistant Examiner* — Norman Yu
(74) *Attorney, Agent, or Firm* — Rossi, Kimms & McDowell LLP

(57) ABSTRACT

A sound effect data generating apparatus has a starting point setting portion, an endpoint setting portion, a travel point defining portion and a data generating portion. The starting point setting portion and the endpoint setting portion set a starting point and an endpoint specified by position information, respectively. The travel point defining portion sequentially defines a point which is situated on a line connecting between the set starting point and the set endpoint and is specified by position information, as a travel point in accordance with progression of reproduced tone signals. The data generating portion determines a value of at least one parameter on one sound effect which is to be added to the tone signals on the basis of the position information of the defined travel point, the set starting point and the set endpoint, and generates sound effect data in accordance with the determined parameter value.

20 Claims, 9 Drawing Sheets

FIG.2

31

| sound effect type | | parameter 1 | | parameter 2 | | (parameter 3) |
|---|---|---|---|---|---|---|
| Low Pass Filter | name ▶ | Cutoff Frequency | name ▶ | Resonance (resonance, degree of resonance) | name ▶ | Dry/Wet (tone volume balance between original tones) |
| | range | 10Hz ~ 20kHz | range | -20dB ~ +20dB | range | 0% ~ 100% |
| Delay | name ▶ | Delay Time | name ▶ | Feedback (amount of feedback) | name ▶ | Pan (localization of delayed tones) |
| | range | 1ms ~ 5000ms | range | 0% ~ 100% | range | L ~ R |
| ... | | | | | | |

FIG.3

32

| | |
|---|---|
| section range from starting point to endpoint | (quarter note × 4) quarter note × 3 quarter note × 2 eighth note × 6 eighth note × 3 half note × 2 quarter note × 8 … |
| interval between generation of sound effect data | quarter note (eighth note) sixteenth note thirty-second note sixty-fourth note … |
| type of line connecting between starting point and endpoint |  … |
| effect end timing | (①when arriving at canceled return point (starting point/ endpoint)) ②when being instructed to stop (including time when both starting point and endpoint are canceled) ③when predetermined period of time (such as one minute) has elapsed after start of effect … |
| ⋮ | ⋮ |

SOUND EFFECT DATA GENERATING APPARATUS

BACKGROUND OF THE INVENTION

1. Field of the Invention

The present invention relates to a sound effect data generating apparatus which determines respective values of sound effect parameters and generates sound effect data in accordance with the determined parameter values.

2. Description of the Related Art

Conventionally, there are known sound effect data generating apparatuses which determine respective values of sound effect parameters and generate sound effect data in accordance with the determined parameter values. Such conventional sound effect data generating apparatuses include an electronic musical apparatus which displays the first display object associated with a control operating element and the second display object associated with a tone color effect parameter on a display unit, and controls to change the display position of the first display object in accordance with user's operation of the control operating element (see Japanese Unexamined Patent Publication No. 2009-300892, for example). According to the apparatus, more specifically, in accordance with a change in positional relationship of the displayed first display object, a control value of the tone color effect parameter associated with the second display object is determined to control musical tones in accordance with the determined control value.

Furthermore, there also is a conventional electronic musical apparatus configured such that when a user performs a predetermined operation, respective display positions of the first and/or second display objects are controlled so that a moving operation which continues in terms of time in accordance with a previously associated action manner can be autonomously done even if the user's operation is not being done continuously (see Japanese Unexamined Patent Publication No. 2010-66655, for example). According to the apparatus, more specifically, in accordance with displayed positional relationship between the first display object which conducts the autonomous moving operation and the second display object, a control value of a tone pitch or a tone color effect parameter of musical tones associated with the second display object is determined to control musical tones on the basis of the determined control value.

SUMMARY OF THE INVENTION

However, the former apparatus of the above-described conventional electronic musical apparatuses controls the display such that the first display object (source object) moves along a rail object. More specifically, although the manner in which an effect is added varies according to the shape of rail object, a minimum value and a maximum value predetermined for each parameter are set for a starting point and an endpoint of the rail object, respectively. On the former apparatus, therefore, a user is required to perform manipulation on the rail object displayed on the screen, guessing where user's intended range of parameter value of a desired effect is.

Furthermore, the latter apparatus of the above-described conventional electronic musical apparatuses is configured such that the autonomous moving operation manner is determined in accordance with the mode of the user operation. Therefore, although the user is able to choose a moving operation manner in which the first display object moves between a position at which the first display object was situated before user's manipulation and the position of the second display object to make a return trip, the user is required to perform a predetermined operation mode in order to choose the moving operation manner.

The present invention was accomplished to solve the above-described problems, and an object thereof is to provide a sound effect data generating apparatus which can generate sound effect data that keeps varying, by simple user operation. As for descriptions about respective constituent features of the present invention, furthermore, reference letters of corresponding components of an embodiment described later are provided in parentheses to facilitate the understanding of the present invention. However, it should not be understood that the constituent features of the present invention are limited to the corresponding components indicated by the reference letters of the embodiment.

In order to achieve the above-described object, it is a feature of the present invention to provide a sound effect data generating apparatus including a starting point setting portion (S6, S23) for setting a starting point specified by position information; an endpoint setting portion (S6, S33) for setting an endpoint specified by position information; a travel point defining portion (S14) for sequentially defining a point which is situated on a line connecting between the set starting point and the set endpoint and is specified by position information, as a travel point in accordance with progression of a series of reproduced tone signals; and a data generating portion (S15) for determining a value of at least one parameter on one sound effect which is to be added to the series of tone signals on the basis of the position information of the defined travel point, the position information of the set starting point and the position information of the set endpoint, and generating sound effect data in accordance with the determined parameter value.

In this case, the travel point defining portion may define a point situated on the line connecting between the set starting point and the set endpoint as a travel point at each arrival at timing corresponding to a reproduction tempo of the series of tone signals, for example. Furthermore, the starting point setting portion and the endpoint setting portion may set the starting point and the endpoint, respectively, in accordance with user's touch positions on a touch panel display (3). Furthermore, the series of tone signals, the sound effect and the parameter may be selected by a user (S2), for example. Furthermore, an upper limit value and a lower limit value of the parameter may be determined according to the position information that specifies the starting point and the endpoint.

Furthermore, in a state where the starting point and the endpoint are set effective, the data generating portion may continue generating sound effect data; and the travel point defining portion may sequentially define a travel point which travels from the starting point toward the endpoint, sequentially define a travel point which travels from the endpoint toward the starting point after arrival of the travel point at the endpoint, and sequentially define a travel point which travels from the starting point toward the endpoint again after arrival of the travel point at the starting point (S12, S25, S53 to S64, S74, S75). Furthermore, in a state where at least either the starting point or the endpoint is no longer effective, the data generating portion may continue generating sound effect data until arrival of the travel point at the starting point or the endpoint situated immediately before the starting point or the endpoint which is no longer effective (S12, S16, S74 to S76).

By this feature of the invention, in response to the setting of a starting point and an endpoint specified by position information, the travel point defining portion sequentially defines a point situated on a line connecting between the set starting point and the set endpoint as a travel point in accordance with progression of a series of reproduced tone signals. In accordance with the position information of the defined travel point, the position information of the set starting point, and the position information of the set endpoint, furthermore, the data generating portion determines a value of a parameter on a sound effect which is to be added to the series of tone signals, and generates sound effect data in accordance with the determined parameter value. According to the feature of the invention, as a result, sound effect data which keeps varying can be generated only by user's simple operation of setting the two points, the starting point and the endpoint.

It is another feature of the present invention that the starting point setting portion and the endpoint setting portion set respective coordinate positions situated on an identical coordinate plane of two or more dimensions as the starting point and the endpoint, respectively; and the data generating portion determines respective values of the same number of parameters as the number of the dimensions so that a value of each parameter can be associated with a different coordinate axis, and generates the same number of sound effect data sets as the number of the dimensions in accordance with the determined parameter values. This feature of the invention enables a user to concurrently vary respective manners in which the same number of sound effect data sets as the number of dimensions vary, and to individually specify the respective manners in which the sound effect data sets vary, only by user's setting of the starting point and the endpoint.

It is still another feature of the present invention that the sound effect data generating apparatus further includes a time length setting portion (S2) for setting a time length for the entire line connecting between the set starting point and the set endpoint; and a time interval setting portion (S2) for setting a time interval between arrivals of timing corresponding to the reproduction tempo, wherein the travel point defining portion defines a point situated on the line as a travel point in accordance with the set time length for the entire line and the set time interval. In this case, the time length setting portion may set a multiple of a predetermined note length as the time length, or sets the time length on a bar basis, for example. Furthermore, the time interval setting portion may set the time interval on a predetermined note length basis, for example. According to this feature of the invention, the sound effect varies in synchronization with the tempo of the series of tone signals such as a musical piece or rhythm which is to be reproduced. Therefore, the feature of the invention eliminates the necessity for a user to operate the apparatus in order to continuously change a sound effect with the passage of time.

It is a further feature of the present invention that the sound effect data generating apparatus further includes a display portion (3, S65) for displaying a position of the travel point defined by the travel point defining portion. This feature enables the user to visually recognize a state in which the sound effect data which varies with the passage of time is generated.

Furthermore, the present invention can be embodied not only as the sound effect data generating apparatus but also as a sound effect data generating method, a sound effect data generating program and a computer-readable storage medium storing the sound effect data generating program.

BRIEF DESCRIPTION OF THE DRAWINGS

FIG. 2 is an example of sound effect types and sound effect parameters selectable as those which are to be controlled on the sound effect data generating apparatus of FIG. 1;

FIG. 3 is an example of options of setting information necessary for generation of sound effect data on the sound effect data generating apparatus of FIG. 1;

DESCRIPTION OF THE PREFERRED EMBODIMENT

Figure 1:
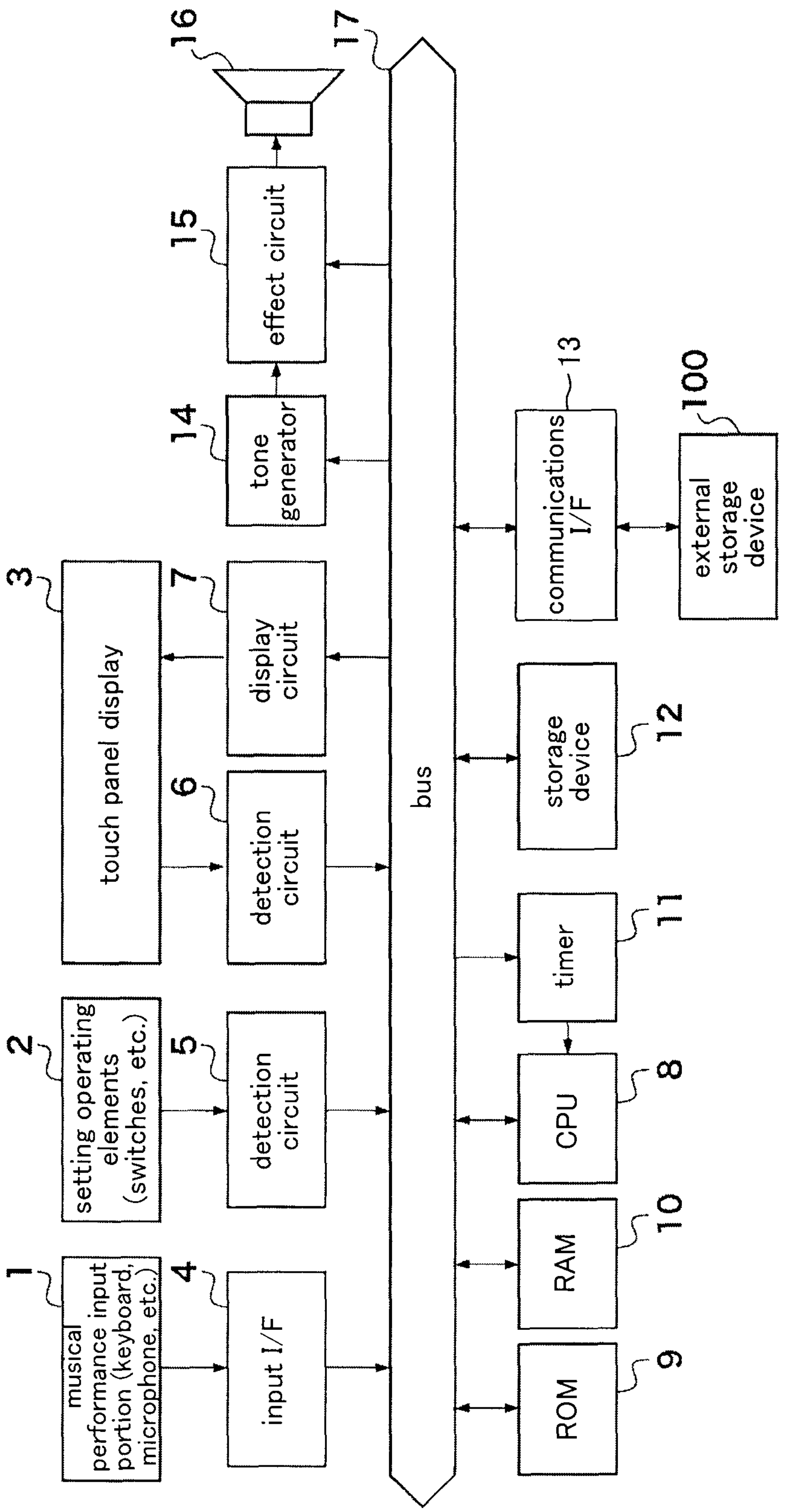
FIG. 1 is a block diagram indicative of a schematic configuration of a sound effect data generating apparatus according to an embodiment of the present invention.

An embodiment of the present invention will now be described with reference to the drawings. FIG. 1 is a block diagram indicative of a schematic configuration of a sound effect data generating apparatus according to the embodiment of the present invention.

As indicated in FIG. 1, the sound effect data generating apparatus of the embodiment has a musical performance input portion 1, setting operating elements 2, a touch panel display 3 (hereafter simply referred to as a touch panel 3), an input interface 4 (hereafter simply referred to as an input I/F 4), detection circuits 5 and 6, and a display circuit 7. The musical performance input portion 1 includes a keyboard for inputting key-depression/release information including tone pitch information and intensity information which corresponds to user's key-depression/key-release, and a microphone for collecting sounds generated by a user and converting the collected sounds into analog sound signals. The musical performance input portion 1 inputs musical performance information indicative of user's musical performance operation, and sound information. The setting operating elements 2 are composed of a plurality of switches for inputting various kinds of information.

The touch panel 3 displays various kinds of UIs (user interfaces), and is used to input various kinds of information by user's manipulation of the displayed various kinds of UIs such as by the touch of a finger on the touch panel 3. The input I/F 4 converts key-depression/key-release information input from the keyboard into musical performance data such as MIDI (musical instrument digital interface) data (event data), and stores the event data in an event buffer (not shown) for temporary storage. In addition, the input I/F 4 converts analog sound signals input from the microphone into digital sound signals (sound data), and stores the sound signals in a sound data buffer (not shown) for temporary storage. The detection circuit 5 detects user's manipulation of the setting operating elements 2. The detection circuit 6 detects user's pressing operation such as position of user's manipulation and pressure of user's manipulation on the touch panel 3. The display circuit 7 displays the above-described various kinds of UIs on the touch panel 3.

Furthermore, the sound effect data generating apparatus also has a CPU (central processing unit) 8, a ROM (read only memory) 9, a RAM (random access memory) 10, a timer 11, a storage device 12 and a communications interface (hereafter simply referred to as a communications I/F) 13. The CPU 8 controls the operation of the entire apparatus. The ROM 9 stores control programs which the CPU 8 executes, and various kinds of table data. The RAM 10 temporarily stores musical performance data, various kinds of input information, computed results, and the like. The timer 11 is connected with the CPU 8 to count various kinds of time including interrupt time on timer interrupt processing.

The storage device 12 is composed of storage media such as flexible disk (FD), hard disk (HD), CD-ROM, DVD (digital versatile disc), magneto-optical disc (MO) and semiconductor memory, and their respective drives so that the storage device 12 can store various kinds of application programs including the control programs, various kinds of musical piece data (song data), various kinds of data, and the like. These storage media may be detachable from their respective drives. Furthermore, the storage device 12 itself may be detachable from the sound effect data generating apparatus of the embodiment. Alternatively, both the storage media and the storage device 12 may be undetachable. In (the storage media of) the storage device 12, the control programs which the CPU 8 executes can be stored, as described above. In a case where the control programs are not stored in the ROM 9, therefore, the control programs may be stored in the storage device 12 so that the control programs can be read into the RAM 10 to allow the CPU 8 to operate similarly to the case where the control programs are stored in the ROM 9. By storing the control programs in the storage device 12, addition and updating of the control programs are facilitated.

The communications I/F 13 is connected to an external storage device 100 to refer to or retrieve various kinds of musical piece data and the like stored in the external storage device 100. As the communications I/F 13, a general-purpose short-distance wired I/F such as USB (universal serial bus) and IEEE 1394, a general-purpose network I/F such as Ethernet (trademark), or a general-purpose short-distance wireless I/F such as wireless LAN (local area network) and Bluetooth (trademark) can be used. In this embodiment, Ethernet is employed as the communications I/F 13. With the communications I/F 13, the external storage device 100 located on the Internet such as the external storage device 100 connected to a server computer is connected. In this embodiment, the server computer (the external storage device 100) serves as a source which supplies various kinds of musical piece data. In a case where the various programs and various parameters are not stored in the storage device 12, furthermore, the server computer may also serve as a source which supplies the programs and parameters. In this case, the sound effect data generating apparatus which serves as a client sends commands requesting downloading of the programs and/or parameters to the server computer via the communications I/F 13 and the Internet. Receiving the commands, the server computer distributes the requested programs and/or parameters to the sound effect data generating apparatus via the Internet. Then, the sound effect data generating apparatus receives the programs and/or parameters via the communications I/F 13, and stores the received programs and/or parameters in the storage device 12 to complete the downloading.

Furthermore, the sound effect data generating apparatus also has a tone generator 14, an effect circuit 15, and a sound system 16. The tone generator 14 converts musical performance data input from the musical performance input portion 1, musical piece data (musical performance data) reproduced by a sequencer (not shown), and the like into musical tone signals. The sequencer performs a function realized by the CPU 8 executing a sequencer program. The tone generator 14 may be any type such as waveform memory type, FM (frequency modulation) type, physical model type, harmonic synthesis type, format synthesis type, analog synthesizer type including VCO (voltage controlled oscillator), VCF (voltage controlled filter) and VCA (voltage controlled amplifier), and analog simulation type. Furthermore, the tone generator 14 may employ a tone generating circuit configured by use of a dedicated hardware, a tone generator (circuit) configured by use of a DSP (digital signal processor) and a microprogram, or a tone generator (circuit) configured by the CPU 8 and a software program, or may employ a combination of these configurations.

The effect circuit 15 is connected to the tone generator 14 so as to add various kinds of effects to musical tone signals supplied from the tone generator 14. The effect circuit 15 has registers so that parameter values can be stored for respective sound effect parameters. In accordance with the parameter values stored in their respective registers, the effect circuit 15 adds a certain effect to musical tone signals supplied from the tone generator 14. The sound system 16 includes a DAC (digital-to-analog converter), an amplifier, a speaker and the like, and is connected to the effect circuit 15 so as to convert musical tone signals supplied from the effect circuit 15 into sound signals. The above-described components 4 to 15 are connected with each other via a bus 17.

As apparent from the above-described configuration, the sound effect data generating apparatus of the embodiment is provided on an electronic keyboard musical instrument. However, the sound effect data generating apparatus may be provided on a general-purpose personal computer (PC) to which a keyboard is externally connected. Without a keyboard, furthermore, the sound effect data generating apparatus may employ a form of string instrument, a form of wind instrument and the like. By such forms, the present invention can be also realized. Not only to the electronic musical instrument, furthermore, but also to electronic apparatuses such as a general-purpose PC without an externally connected keyboard, a smart device and a game device, the present invention can be also applied.

FIG. 2 indicates an example of sound effect types and sound effect parameters which are selectable as a type and parameters to be controlled. FIG. 2 also indicates a type setting screen 31 displayed on the touch panel 3 when a sound effect type and sound effect parameters are set. As indicated in FIG. 2, various types of sound effects are provided, so that one sound effect type selected from among the various types of sound effects by a user is to be controlled. Each sound effect type has a plurality of sound effect parameters so that the user can choose some (two parameters, in this embodiment) of the parameters as parameters to be controlled.

The sound effect parameters to be controlled, that is, parameters 1 and 2 are to be controlled in accordance with points on two-dimensional coordinate plane where an X-axis to which the parameter 1 is assigned is orthogonal to a Y-axis to which the parameter 2 is assigned. Since the two-dimensional coordinate plane is employed only for the sake of simplifying explanation and of facilitating drawing the figures, the number of parameters to be controlled may be increased to three to have parameters 1 through 3 to assign parameter 3 to a Z-axis to employ a three-dimensional coordinate plane. As described above, although it is possible to increase the number of parameters to three, the number of parameters is limited to two in this embodiment, with the parameter 3 being parenthesized. The assignment of the parameters 1 and 2 to the axes X and Y, and the control (determination) of respective values of the parameters 1 and 2 in accordance with points on the two-dimensional coordinate plane will be described later with reference to FIG. 4.

For selecting and setting a sound effect type on the type setting screen 31, the user is to touch the name of the user's desired sound effect type. In response to user's touch, the (field of) touched name is highlighted to indicate that the sound effect type of the touched name has been set. In this embodiment, since the sound effect type "Delay" is set (see FIG. 4), the field of "Delay" is diagonally shaded. The diagonal lines are one example of highlight, and are employed for easy drawing of the figure. Therefore, the highlight may be any manner such as reversed characters, change in character color, and change in background color of the field.

Before or after setting the sound effect type, the user is allowed to change the two sound effect parameters which are to be controlled on the sound effect type. That is, the user is allowed to change the sound effect parameters assigned to the parameters 1 and 2. Generally, three or more sound effect parameters belong to one sound effect type, though the number of belonging parameters varies among sound effect types. In this embodiment, however, since it is impossible to set three or more (four or more if the three-dimensional coordinates are employed) sound effect parameters to be controlled, the user is to select any desired parameters as target parameters in a case there are three or more parameters for a sound effect type. On respective "name" fields of the parameters 1 and 2 (and 3), therefore, "▼" is displayed. By a user's touch of "▼", a drop-down list of names of selectable sound effect parameters is displayed to allow the user to select a desired sound effect parameter from among the listed names. If the user selects a sound effect parameter, the range of programmable parameter value of the selected sound effect parameter is displayed on a "range" field.

The feature of the present invention lies not in the content of each sound effect parameter on which sound effect data is based, but in how the value of each sound effect parameter on which sound effect data is based is generated. Therefore, the explanation on the content of each sound effect parameter on which sound effect data is based will be omitted.

FIG. 3 indicates an example of selectable options of setting information required for generation of sound effect data. Furthermore, FIG. 3 also indicates an information setting screen 32 displayed on the touch panel 3 when the user specifies the setting information. The information setting screen 32 indicates four major kinds of setting information as examples. Hereafter, the contents of the four kinds of setting information will be concretely explained with reference to a sound effect generation screen 33 indicated in FIG. 4.

In "section range from starting point to endpoint", a section range from a starting point SP to an endpoint EP, that is, a time length is specified. In the shown example, multiples of note lengths are provided as selectable options, with "quarter note×4" being selected. However, the section range may be specified in bars. The selected option is indicated by encompassing the selected option with an ellipse.

In "interval between generation of sound effect data", the time interval between which sound effect data is generated is specified. In the shown example, notes (note lengths) starting with the longest quarter note (length) and obtained by halving the note one after another are listed, with "eighth note" being selected. However, a half note, a whole note, a dotted quarter note and the like may be included in the options.

In "type of line connecting between starting point and endpoint", the shape of a line connecting between the starting point SP and the endpoint EP is specified. In the shown example, a straight line and a plurality of curves each having a different shape are provided as options, with the "straight line" being selected. Although the selected "straight line" is diagonally right-up, that is, increases monotonically, an increase/decrease is determined according to the positional relationship between the starting point and the endpoint. In a case where the endpoint is greater than the starting point in the x-coordinate, with the starting point being greater than the endpoint in the y-coordinate, for example, the "straight line" is to be diagonally right-down even if the diagonally right-up "straight line" shown in FIG. 3 has been selected. This situation will be similarly applied to cases where any of the other "curves" is selected.

In "effect end timing", the timing when the generation of sound effect data is terminated is specified. In the shown example, "when arriving at canceled return point (starting point/endpoint)" is selected.

A control process executed by the sound effect data generating apparatus configured as above will be briefly explained with reference to FIG. 4, followed by a detailed explanation with reference to FIG. 5 to FIG. 8.

Figure 4:
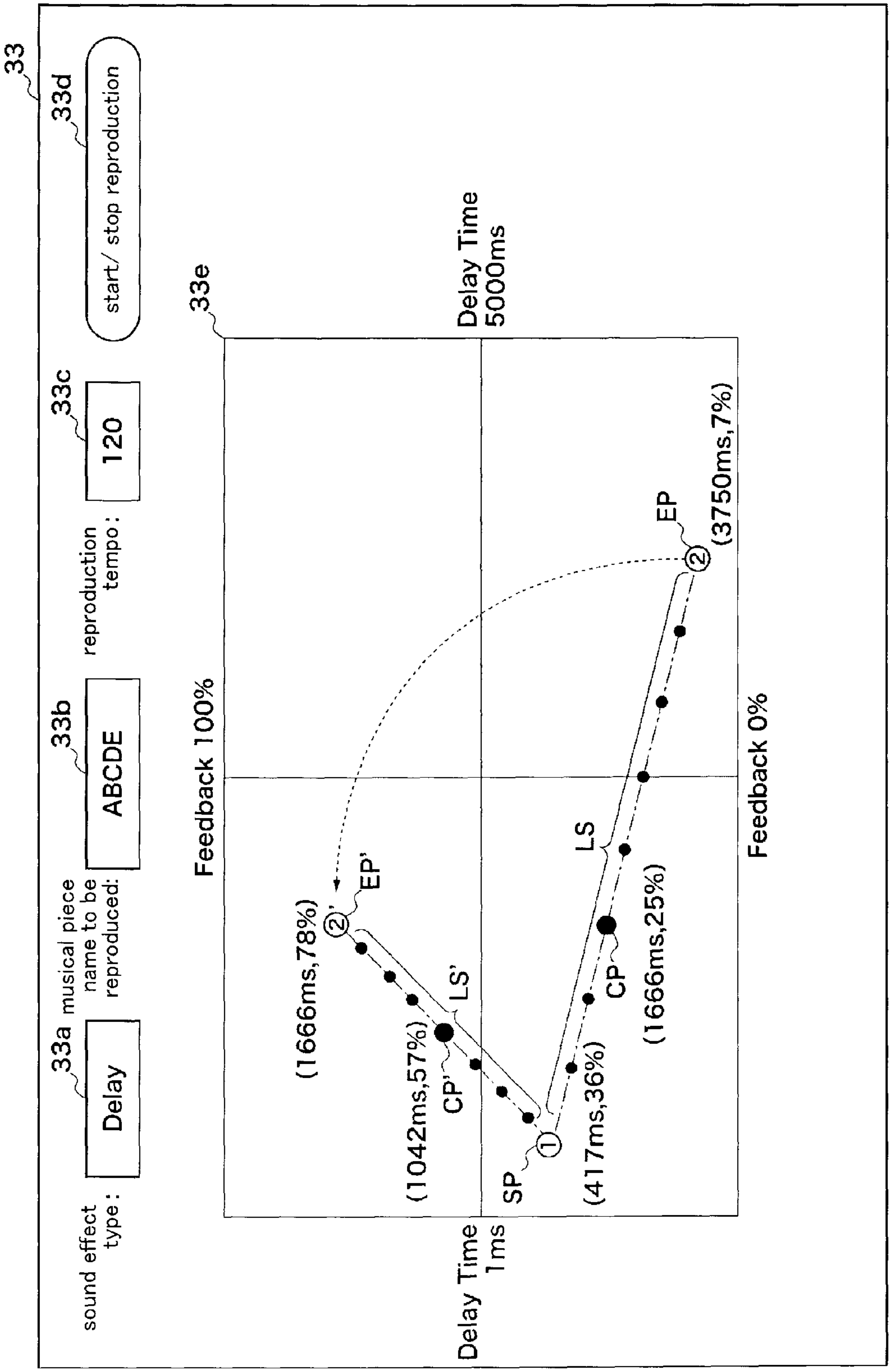
FIG. 4 is an example of a sound effect generation screen displayed on a touch panel display when sound effect data is generated on the sound effect data generating apparatus of FIG. 1.

FIG. 4 indicates an example of the sound effect generation screen 33 displayed on the touch panel 3 at the time of generation of sound effect data. FIG. 4 indicates a case where the sound effect named "Delay" is selected as a sound effect type, while data of a musical piece named "ABCDE" is selected as musical piece data to be reproduced, with "120" being selected as reproduction tempo.

On an initial screen of the sound effect generation screen 33 of the above-described state, "Delay", "ABCDE" and "120" are displayed at display fields 33*a* to 33*c* indicative of a sound effect, a musical piece to be reproduced, and a reproduction tempo, respectively, with a reproduction start/stop button 33*d* being displayed. Furthermore, a two-dimensional coordinate plane (hereafter abbreviated as "coordinate plane") 33*e* formed of an X-axis (horizontal axis) and a Y-axis (vertical axis) to which the parameters 1 and 2 are assigned is displayed on the initial screen. In other words, the coordinate plane 33*e* of the initial state can be obtained by deleting a line segment LS and a line segment LS' from the coordinate plane 33*e* of FIG. 4.

Since the parameters 1 and 2 are set for the sound effect parameters "Delay Time" and "Feedback", respectively, as described above (see FIG. 2), the sound effect parameters "Delay Time" and "Feedback" are automatically assigned to the X-axis and the Y-axis of the coordinate plane 33*e*, respectively. To the minimum value and the maximum value of each of the axes, furthermore, the minimum value and the maximum value indicated in the "range" of each sound effect parameter are automatically assigned. More specifically, the minimum value "1 ms" and the maximum value "5000 ms" of "Delay Time" are assigned to the left end and the right end of the X-axis, respectively, while the minimum value "0%" and the maximum value "100%" of "Feedback" are assigned to the lower end and the upper end of the Y-axis, respectively.

By user's touch of a point with a user's finger, for example, on the coordinate plane 33*e* of such an initial state, the position of the touched point is defined as the starting point SP. Then, if the user touches a different point with user's another finger on the coordinate plane 33*e* while keeping the first finger on the point, the position of the different point is defined as the endpoint EP. In this embodiment, in order to maintain the defined state of both the starting point SP and the endpoint EP, it is necessary to keep the both fingers touching the points. An endpoint EP' represents a case where the endpoint EP has been moved. Therefore, the line segment LS from the starting point SP to the endpoint EP and the line segment LS' from the starting point SP to the endpoint EP' cannot be displayed concurrently. At the moment, only the line segment LS from the starting point SP to the endpoint EP is displayed.

The temporal length (time length) of the line segment LS is "quarter note×4" defined in "section range from starting point to endpoint" on the information setting screen 32 shown in FIG. 3. Therefore, sound effect data is to be generated at intervals of "eighth note" specified in the "interval between generation of sound effect data" on the screen 32 within the defined time length. On the line segment LS, in order to allow the user to recognize the generation intervals at a glance, small pieces of "●" are displayed at positions representative of timings when the sound effect data is generated. A large piece of "●" indicates a current reproduction position (hereafter abbreviated as "current position") CP of the reproduced musical piece (musical piece data of the musical piece named "ABODE" in the shown example). At the moment, the current position CP is not shown.

In this state, if the user touches the reproduction start/stop button 33*d*, the reproduction is started, so that the current position CP follows the small "●" one by one from the starting point SP toward the endpoint EP at each lapse of time equivalent to "eighth note". The sound effect generation screen 33 (the line segment LS' is not shown) of FIG. 4 indicates a state where the time equivalent to three "eighth notes" has passed since the start of the reproduction.

Each time the current position CP reaches one of the small pieces of "●", a coordinate of the small piece of "●" is read out. In accordance with the read coordinate, the parameter value of "Delay Time" and the parameter value of "Feedback" are determined. In accordance with the determined parameter values, furthermore, sound effect data is generated. In this embodiment, however, determining the parameter values means generating sound effect data (see explanation of step S73 of FIG. 8 which will be described later). The generated sound effect data, that is, the determined parameter values are supplied to the effect circuit 15 to be stored in corresponding registers provided in the effect circuit 15. In accordance with the parameters stored in the registers, the effect circuit 15 adds a predetermined effect to musical tone signals supplied from the tone generator 14, that is, musical tone signals obtained by reproducing the musical piece data of the musical piece named "ABCDE", and then supplies the effect-added musical tone signals to the sound system 16. Since each piece of "●" has a different coordinate, parameter values determined when a coordinate of a piece of "●" is read out are also different among the pieces of "●". As a result, the effect which is to be added each time the current position CP reaches a small piece of "●" is the same type but is auditorily different.

If the current position CP reaches the endpoint EP, the current position CP reverses the direction of travel, in other words, turns around to proceed toward the starting point SP. If the current position CP then reaches the starting point SP, the current position CP similarly turns around to proceed toward the endpoint EP to repeat traveling between the starting point SP and the endpoint EP.

If the user has released either of the fingers being in touch with the starting point SP and the endpoint EP during the traveling of the current position CP between the starting point SP and the endpoint EP, the display of the released point is turned off, or the display of the released point is changed to cancel the point. Since "effect end timing" is defined on the information setting screen 32 as "when arriving at canceled return point (starting point/endpoint)", the generation of sound effect data is terminated when the current position CP reaches the point (return point).

If the user moves the endpoint EP to the endpoint EP' before the start of reproduction or during reproduction, the line segment LS is changed to the line segment LS'. In comparison between the line segment LS' and the line segment LS, the line segment LS' is shorter than the line segment LS. As for the inclination of the line segments, furthermore, the line segment LS has a diagonally right-down mild slope, while the line segment LS' has a diagonally right-up steep slope. On the assumption that the line segments have the same inclination, having a shorter line segment means that the range in which the parameter is changed is smaller. On the assumption that the line segments have the same length, having a steeper slope means that the amount of change in "Feedback" with respect to the amount of change in "Delay Time" increases/decreases more. Furthermore, having a diagonally right-down slope indicates that "Feedback" is reducing, while having a diagonally right-up slope indicates that "Feedback" is increasing. However, the diagonally right-up/right-down slope is applied to a case where the current position CP moves from the starting point SP toward the endpoint EP (toward the endpoint EP'). In a case where the current position CP moves in the inverse direction, the line segments have diagonally left-up/left-down slopes.

According to the sound effect data generating apparatus of this embodiment, only by inputting two points on (the coordinate plane 33*e* of) the touch panel 3, a sound effect which keeps changing can be added to musical tone signals obtained by reproducing musical piece data. Furthermore, since the sound effect changes in synchronization with a reproduced musical piece (or rhythm), the sound effect data generating apparatus eliminates the necessity for the user to perform manipulations for continuously changing sound effect.

Furthermore, the sound effect data generating apparatus allows the user to individually and easily specify respective effective ranges of parameter values and respective tendencies of change such as an abrupt increase and a mild decrease for a plurality of parameters to be controlled. In addition, since the sound effect data generating apparatus allows the user to make the settings even during reproduction of musical piece data, the user can easily change respective ranges of parameter values and respective tendencies of change while actually adding an effect to reproduced sounds and checking the added sound effect.

According to the sound effect data generating apparatus of this embodiment, furthermore, the range of the value of a parameter and the tendency of change in the parameter value to which an effect will be added are calculated individually for each parameter in accordance with the positional relationship between two points input on the touch panel 3. Therefore, the user can generate an effect by the intuitive manipulation, and can easily try various combinations. Furthermore, since the user can concurrently change parameter values involved in a target sound effect, the user can easily obtain an effect having acoustically significant change.

Figure 5:
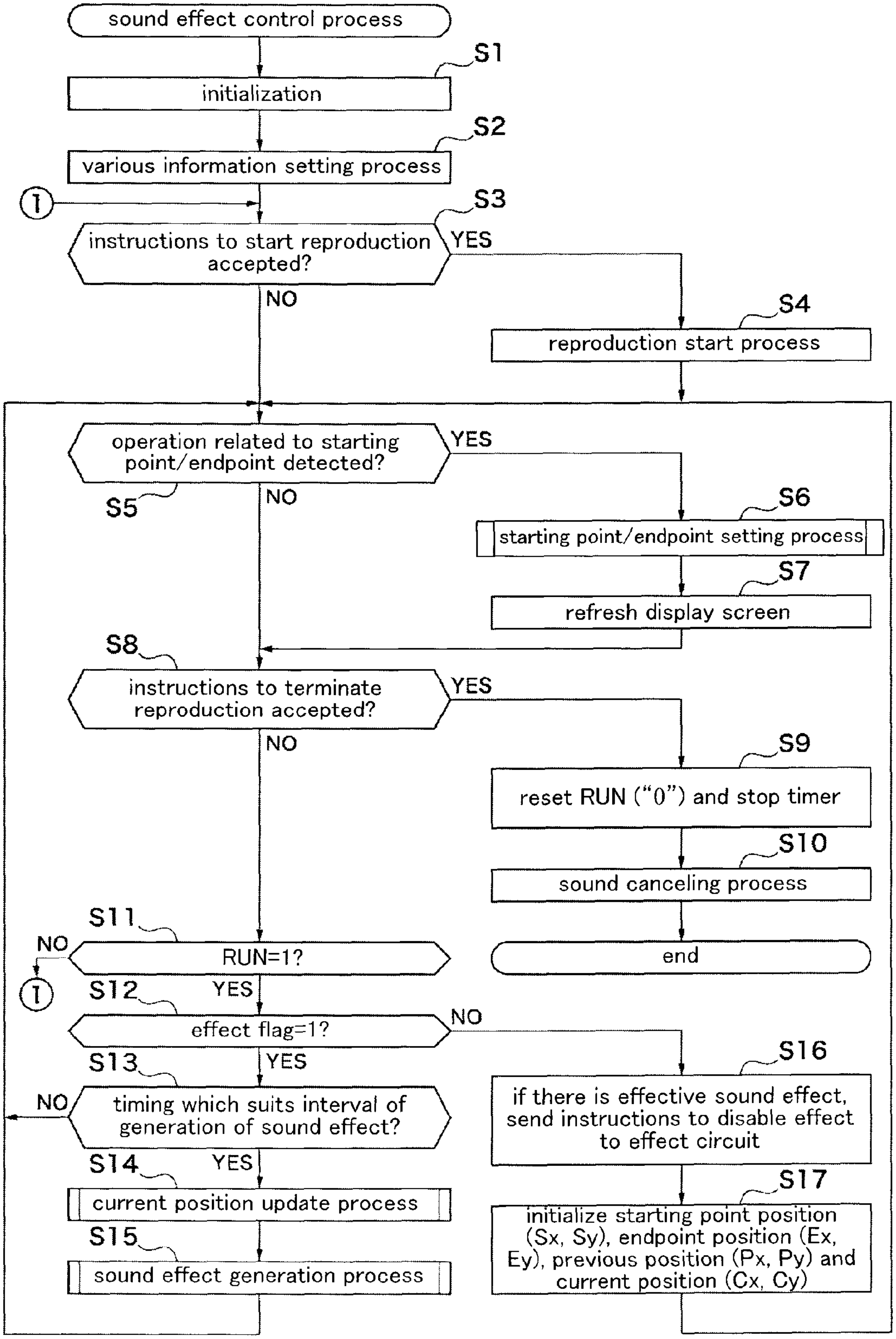
FIG. 5 is a flowchart indicative of procedures of a sound effect control process executed by the sound effect data generating apparatus of FIG. 1, particularly by a CPU.

Next, this control process will be explained in detail. FIG. 5 is a flowchart indicative of procedures of a sound effect control process executed by the sound effect data generating apparatus of this embodiment, particularly by the CPU 8.

The sound effect control process is composed mainly of the following processes (1) to (7):

(1) start process (steps S1 and S2)

(2) reproduction start process (step S4)

(3) starting point/endpoint-related operation detection process (steps S6 and S7)

(4) current position update process (step S14)

(5) sound effect generation process (step S15)

(6) sound effect reset process (steps S16 and S17)

(7) reproduction termination process (steps S9 and S10).

The sound effect control process is started by user's start instructions. More specifically, the start instructions can be a user's touch of a button displayed on the touch panel 3, a user's operation of turning on a switch included in the setting operating elements 2 or the like.

When the sound effect control process is started, the CPU 8 carries out the above-described start process (1) once, and then checks whether a user's operation related to the starting point or the endpoint has been detected until instructions to start reproduction are made (steps S5→S8→S11→S3→S5). If a user's operation relating to the starting point or the endpoint is detected, the CPU 8 carries out the starting point/endpoint-related operation detection process (3) (steps S5→S6→S7). In a state where the instructions to start reproduction have not been made, the CPU 8 performs not only the check of step S5 but also a check whether or not instructions to terminate reproduction have been received (step S8). However, since there can rarely be a possibility that the user makes the instructions to terminate reproduction without making instructions to start reproduction, step S8 performed in this state will not be explained. However, since the sound effect control process is designed such that the sound effect control process cannot be terminated by anything but by the instructions to terminate the reproduction, the sound effect control process may be modified such that the user can make instructions to terminate the sound effect control process, with a process to check whether or not the instructions to terminate the process have been made being added to the sound effect control process. By this modification, in response to reception of the termination instructions, a termination process is performed to terminate the sound effect control process.

If the user instructs to start the reproduction, the CPU 8 carries out the reproduction start process (2) (step S3→S4). After the checks of steps S5 and S8, the CPU 8 judges whether or not any musical piece data is currently being reproduced (step S11). The judgment on reproduction is done by judging whether or not a RUN flag which will be described later has been set ("1"). Since the RUN flag has been set ("1") by the reproduction start process (2) (which will be described in detail later), the CPU 8 proceeds from step S11 to step S12 to judge whether the sound effect should be reset or not. This judgment is done on the basis of an effect flag which will be described later. More specifically, the CPU 8 judges that the sound effect should be reset if the effect flag is in a reset state ("0"). If the effect flag is in a set state ("1"), the CPU 8 judges that the sound effect should not be reset. If the judgment of step S12 resulted in that the sound effect should be reset, the CPU 8 carries out the sound effect reset process (6), and then returns to the check of the above-described step S5. If the judgment resulted in that the sound effect should not be reset, the CPU 8 waits for the timing which suits the interval of generation of sound effect (step S13), and then sequentially carries out the current position update process (4) and the sound effect generation process (5) (steps S14 and S15) to return to the check of step S5.

If the operation related to the starting point or the endpoint is detected during reproduction, the CPU 8 carries out the starting point/endpoint-related operation detection process (3) similarly to the case where any musical piece data is not currently being reproduced (step S5→S6→S7). If the instructions to terminate the reproduction are made during reproduction, the CPU 8 carries out the reproduction termination process (7) (step S8→S9→S10), and then terminates the sound effect control process (step S10→end).

At the start process, the CPU 8 performs an initialization process (step S1) first. In this initialization process, the CPU 8 allocates areas described below on the RAM 10 for initialization:

starting point position (Sx, Sy): an area for storing a coordinate of the starting point (SP) located on the coordinate plane 33*e* of FIG. 4;

endpoint position (Ex, Ey): an area for storing a coordinate of the endpoint (EP) located on the coordinate plane 33*e;* current position (Cx, Cy): an area for storing a coordinate of the current position (CP) located on the coordinate plane 33*e;* previous position (Px, Py): an area for storing a coordinate of the current position (CP) at the timing immediately preceding the current timing for generation of sound effect;

division number storage area: an area for storing the number of parts obtained by dividing the section range from the starting point (SP) to the endpoint (EP) (see the first row of the information setting screen 32 of FIG. 3) by the sound effect data generation interval (see the second row of the information setting screen 32) (hereafter, the "division number" indicates the number of divided parts stored in this area);

musical piece data storage area: an area for storing musical piece data which is to be reproduced; and tempo information storage area: an area for storing a tempo value used for reproduction of the musical piece data.

Next, the CPU 8 secures and initializes (resets) flags described below:

RUN flag: set ("1") during reproduction of musical piece data, and reset ("0") at the other occasions;

starting point flag: set when a starting point is input on the coordinate plane 33*e*, and reset when the starting point is canceled;

endpoint flag: set when an endpoint is input on the coordinate plane 33*e*, and reset when the endpoint is canceled;

effect flag: set in a state where sound effect data can be generated, and reset in a state where sound effect data cannot be generated; and current position update flag: set when the current position (Cx, Cy) is updated in a starting point/endpoint setting process (described in detail later with reference to FIG. 6A and FIG. 6B) included in the starting point/endpoint-related operation detection process (3) to perform a function of avoiding substantial execution of the current position update process (4), and reset in the current position update process (4).

The initialization of the starting point position (Sx, Sy), the endpoint position (Ex, Ey), the current position (Cx, Cy) and the previous position (Px, Py) indicates that the respective coordinates are set at (-, -), for instance. More specifically, "-" indicates "undetermined".

In the initialization process, furthermore, the CPU 8 displays a top screen on the touch panel 3. The top screen is a screen on which a plurality of buttons for instructing to move to different screens are arranged. The plurality of buttons include buttons to which types (categories) of information selectable in a various information setting process which will be explained next are assigned, respectively, and a button for instructing to display the sound effect generation screen 33 of FIG. 4. In this embodiment, the types of information include a musical piece to be reproduced, a sound effect type and setting information necessary for generation of a sound effect.

Next, the CPU 8 carries out the various information setting process (step S2). In the various information setting process, the user is prompted to sequentially choose one kind of information to further choose one of selectable pieces of information belonging to the user's selected kind of information, so that the CPU 8 sequentially fixes the user's chosen pieces of information. More specifically, in a case where the user touches a button (not shown) to which "musical piece for reproduction" is assigned, the CPU 8 displays a list of (names of) various kinds of musical piece data stored in the storage device 12 on the touch panel 3. If the user selects any one from the list, the CPU 8 reads out the selected piece of musical piece data from the storage device 12, and stores the musical piece data in the musical piece data storage area. In a case where a tempo value for reproducing the musical piece data is stored in association with the musical piece data, the CPU 8 stores the tempo value in the tempo information storage area. In a case where the tempo value is not stored in association with the musical piece data, the CPU 8 displays a box for inputting a tempo value on the touch panel 3, for example, to prompt the user to input a desired tempo value. If the user inputs a tempo value on the box, the CPU 8 stores the input tempo value in the tempo information storage area.

In a case where the user touches a button (not shown) to which "sound effect type" is assigned, the CPU 8 displays the type setting screen 31 of FIG. 2, for example, on the touch panel 3. Since the selection of the sound effect type and parameters (two kinds of parameters 1 and 2, in this embodiment) on the sound effect type made on the type setting screen 31 has been already explained in the outline of the control process, the explanation will not be repeated here.

In a case where the user touches a button (not shown) to which "setting information necessary for generation of sound effect" is assigned, the CPU 8 displays the information setting screen 32 of FIG. 3, for example, on the touch panel 3. Since the types and contents of the information selected on the information setting screen 32 have been already explained in the outline of the control process, the explanation will not be repeated here.

In a case where the user touches a button (not shown) to which "display of sound effect generation screen" is assigned, the CPU 8 displays the sound effect generation screen 33 of FIG. 4, for example, on the touch panel 3. On the sound effect generation screen 33 as well, information on a sound effect type, information on a musical piece for reproduction and information on a reproduction tempo can be changed. If the user desires to change the sound effect type, for example, the user is to touch the display field 33*a*. In response to the user's touch, a drop-down list of names of selectable sound effect types is displayed, so that the user can select a user's desired one from the list. A musical piece for reproduction and a reproduction tempo can be changed similarly.

In the reproduction start process (2), the CPU 8 carries out the following processes (2*a*) to (2*c*):

(2*a*) set ("1") the RUN flag;

(2*b*) instruct the timer 11 to start counting time; and (2*c*) in a case where the starting point flag is "1", the endpoint flag is "1", the effect flag is "1", and the current position (Cx, Cy) is set at the initial value (-, -), perform processing similar to steps S29 and S31 of FIG. 6B which will be described later, that is, store the starting point (Sx, Sy) in the current position (Cx, Cy), and set ("1") the current position update flag.

The instructions to start counting time (2*b*) include specifying a cycle for generating a timer interrupt signal, that is, specifying a time interval between timer interrupts. Since the time interval is a period of time (a period of time corresponding to one tick) determined in accordance with a set tempo value in this embodiment, the CPU 8 figures out the time interval (which varies with resolution, that is, with time base, but time (second) for one tick=60/tempo value/time base) corresponding to the tempo value stored in the tempo information storage area, and then supplies the obtained time interval to the timer 11. In accordance with the supplied time interval, the timer 11 generates a timer interrupt signal at each count of the supplied time interval. In response to the signal, the CPU 8 proceeds to the timer interrupt process. In the timer interrupt process, the CPU 8 reproduces musical piece data stored in the musical piece data storage area. Since this embodiment employs the SMF (Standard MIDI File) format for musical piece data, musical piece data is formed of a string composed of a plurality of sets each having a delta time (time between events) and an event. In the timer interrupt process, therefore, the CPU 8 decrements the delta time included in the musical piece data one by one from the top. When reaching "0", the CPU 8 reads out an event located immediately after the delta time of "0" to perform processing corresponding to the read event to reproduce the musical piece data. Of course, this embodiment may employ MIDI data of a different format. Furthermore, this embodiment may employ musical performance information of a format which is not a MIDI format, such as OSC (Open Sound Control). Furthermore, musical piece data may include an audio track (part). Furthermore, the entire musical piece data may be formed only of an audio track.

The above-described process (2*c*) is provided in order to generate sound effect data accurately in a case where the start of reproduction has been instructed after the starting point position (Sx, Sy) and the endpoint position (Ex, Ey) had been set.

In the starting point/endpoint-related operation detection process (3), the CPU 8 refreshes a display screen (step S7) after carrying out the starting point/endpoint setting process (step S6). Hereafter, the starting point/endpoint-related operation detection process (3) will be concretely explained, assuming that the sound effect type and the parameters 1 and 2 are defined as those indicated in the type setting screen 31 of FIG. 2 (the diagonally shaded sound effect type "Delay"), and the setting information necessary for generation of sound effect is defined as those indicated in the information setting screen 32 of FIG. 3.

Figure 6A:
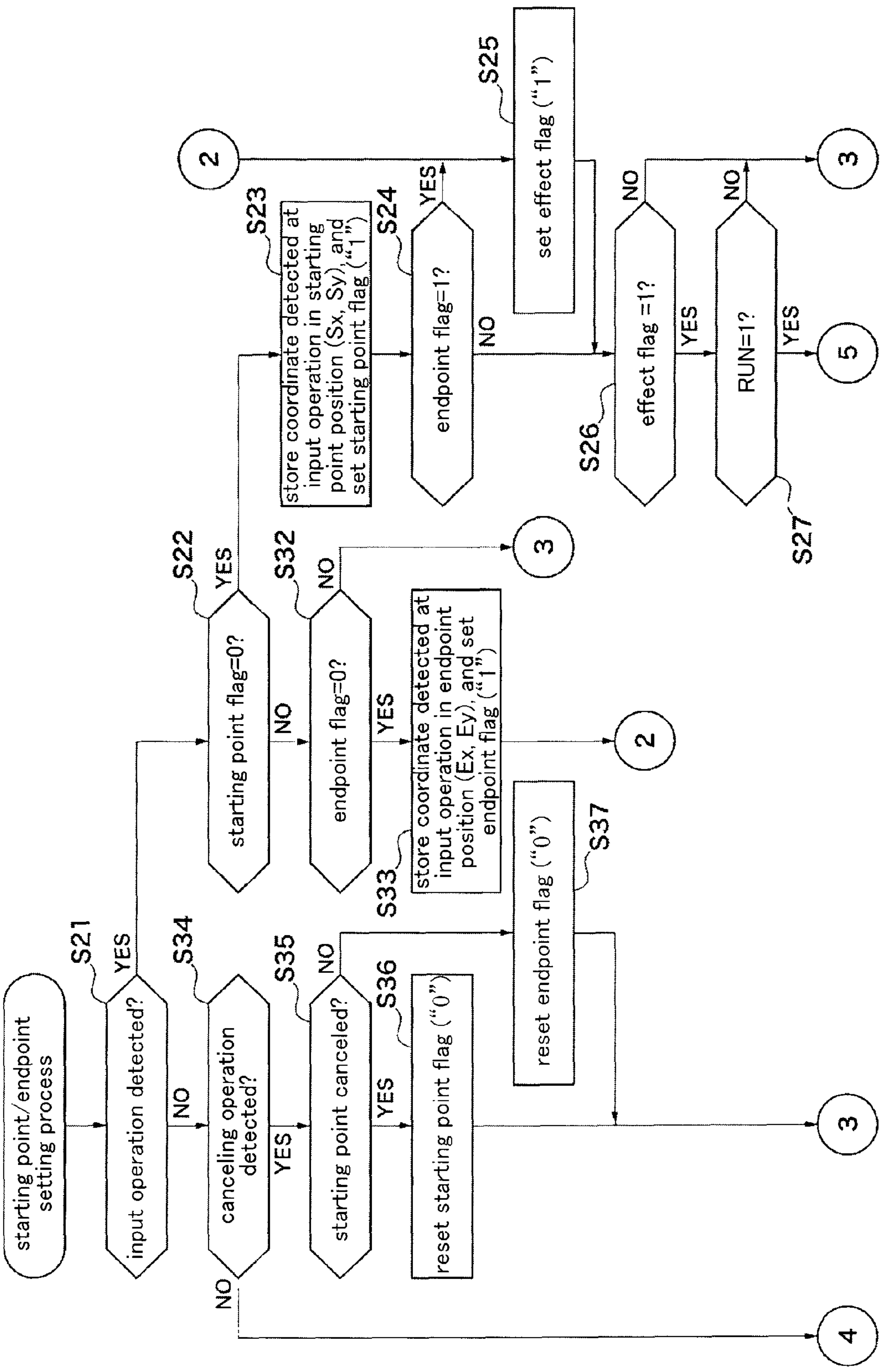
FIG. 6A is a flowchart indicative of detailed procedures of a starting point/endpoint setting process included in FIG. 5.
Figure 6B:
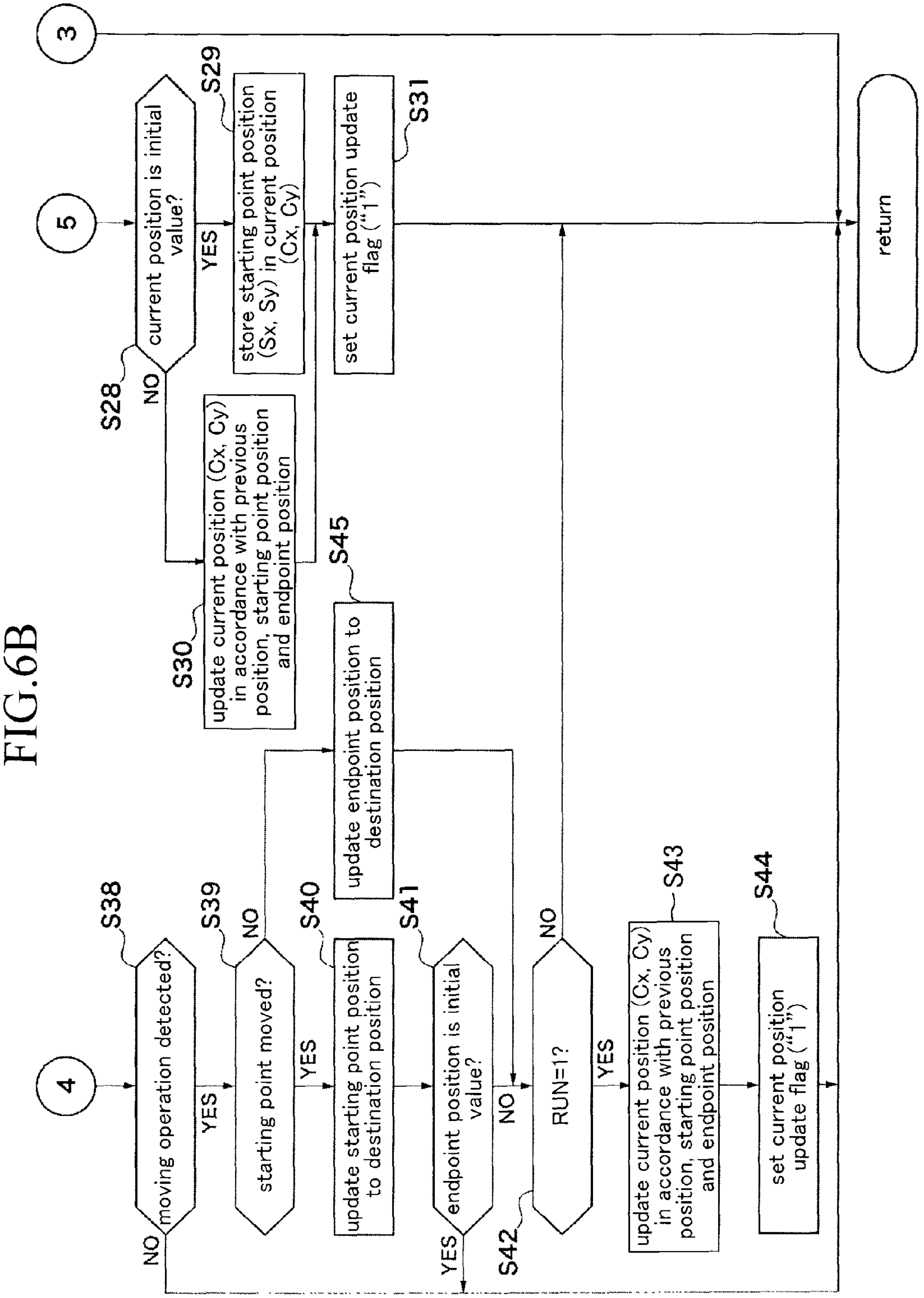
FIG. 6B is a flowchart indicative of procedures which follow the starting point/endpoint setting process of FIG. 6A.

FIG. 6A and FIG. 6B indicate a flowchart showing detailed procedures of the above-described starting point/endpoint setting process.

For the explanation of the starting point/endpoint setting process, cases (31) to (38*b*) are provided as follows:

(31) a case where on the initial screen of the sound effect generation screen 33 of FIG. 4, the user touches one point on the coordinate plane 33*e* and keeps touching the point;
(32) a case where following the case (31), the user touches a different point on the coordinate plane 33*e* and keeps touching the different point;
(33) a case where cancel of the starting point position (Sx, Sy) has been instructed;
(34) a case where cancel of the endpoint position (Ex, Ey) has been instructed;
(35*a*) a case where in the above-described case (33) with no musical piece data being reproduced (RUN=0), the user touches a point other than the endpoint position (Ex, Ey) on the coordinate plane 33*e* again;
(35*b*) a case where in the above-described case (33) with musical piece data being reproduced (RUN=1), the user touches a point other than the endpoint position (Ex, Ey) on the coordinate plane 33*e* again;
(36*a*) a case where in the above-described case (34) with no musical piece data being reproduced, the user touches a point other than the starting point position (Sx, Sy) on the coordinate plane 33*e* again;
(36*b*) a case where in the above-described case (34) with musical piece data being reproduced, the user touches a point other than the starting point position (Sx, Sy) on the coordinate plane 33*e* again;
(37*a*) a case where in a state where no musical piece data is being reproduced, a move of the starting point position (Sx, Sy) is instructed; (37*b*) a case where in a state where musical piece data is being reproduced, a move of the starting point position (Sx, Sy) is instructed;
(38*a*) a case where in a state where no musical piece data is being reproduced, a move of the endpoint position (Ex, Ey) is instructed; and
(38*b*) a case where in a state where musical piece data is being reproduced, a move of the endpoint position (Ex, Ey) is instructed.

In the case (31), since a point located on the coordinate plane 33*e* was touched, the user's input operation is detected. Furthermore, since the starting point flag is "0" (by the initialization of step S1 of FIG. 5), the CPU 8 stores the coordinate detected by the input operation, that is, the operated position detected by the detection circuit 6 in the starting point position (Sx, Sy), and sets the starting point flag ("1") (step S21→S22→S23). Since the endpoint flag is "0" with the effect flag being "0" (by the initialization of step S1) at this moment, the CPU 8 terminates the starting point/endpoint setting process (step S24→S26→return). Then, if the CPU 8 refreshes the display screen (step S7 of FIG. 5), the coordinate plane 33*e* is updated from the initial state to a state where the starting point SP is displayed. The initial state indicates a state where the parameter 1 ("Delay Time") and the parameter 2 ("Feedback") of the selected sound effect type ("Delay") are assigned to the X-axis and the Y-axis of the coordinate plane 33*e*, respectively, with nothing but the starting point SP being displayed on the coordinate plane 33*e*.

In the case (32), since a different point located on the coordinate plane 33*e* was touched, the user's input operation is detected. Furthermore, since the starting point flag is "1" (by the above-described step S23) with the endpoint flag being "0" (by the initialization of step S1), the CPU 8 stores the coordinate detected at the input operation in the endpoint position (Ex, Ey), and sets the endpoint flag ("1") (step S21→S22→S32→S33). Furthermore, the CPU 8 sets the effect flag ("1") (step S25). Since the effect flag is "1" with the RUN flag being "0" (by the initialization of step S1) at this moment, the CPU 8 terminates the starting point/endpoint setting process (step S26→S27→return). Then, if the CPU 8 refreshes the display screen (step S7 of FIG. 5), the coordinate plane 33*e* is updated so that not only the starting point SP but also the endpoint EP is displayed on the coordinate plane 33*e*, with the starting point SP and the endpoint EP being connected by a line of a type ("straight line" in this example) selected as "a type of line connecting between starting point and endpoint". Furthermore, a range ("quarter note×4" in this example) selected as "section range from starting point to endpoint" is set for the section range from the starting point SP to the endpoint EP. Furthermore, the section from the starting point SP to the endpoint EP is broken up at the intervals ("eighth note" in this example) selected as "interval between generation of sound effect data" to display small pieces of "●" at the breakpoints. As a result, the line segment LS is displayed on the coordinate plane 33*e*. However, although the line segment LS of FIG. 4 has a large piece of "●" indicative of the current position CP, a small piece of "●" is displayed instead of the large piece of "●" in this case. In other words, the current position CP will not be displayed.

In the case (33), since the operation (for example, an operation of releasing a finger keeping touching the starting point SP on the coordinate plane 33*e*) of canceling the starting point position (Sx, Sy) was done, the CPU 8 resets the starting point flag ("0") (step S21→S34→S35→S36), and then terminates the starting point/endpoint setting process (return). Then, if the CPU 8 refreshes the display screen (step S7 of FIG. 5), the starting point SP is deleted from the line segment LS displayed on the coordinate plane 33*e*. The manner in which the cancel is represented is not limited to the "deletion" of this case, but may be any manner such as blink or change in color (the modified manner can be similarly applied to the cancel of the endpoint EP which will be described next).

In the case (34), since the operation of canceling the endpoint position (Ex, Ey) was done (the canceling operation is similar to the operation of canceling the starting point SP), the CPU 8 resets the endpoint flag ("0") (step S21→S34→S35→S37), and then terminates the starting point/endpoint setting process (return). Then, if the CPU 8 refreshes the display screen (step S7 of FIG. 5), the endpoint EP is deleted from the line segment LS displayed on the coordinate plane 33*e*.

In the case (35*a*), since a point which is different from the endpoint position (Ex, Ey) was touched on the coordinate plane 33*e* in a state where the starting point position (Sx, Sy) has been canceled, the user's input operation is detected in a state where the starting point flag is "0" (by the above-described step S36). Therefore, the CPU 8 stores the coordinate detected at the input operation in the starting point position (Sx, Sy), and sets the starting point flag ("1") (step S21→S22→S23). Although this embodiment is explained as that a position different from the starting point position (Sx, Sy) whose cancel has been instructed was touched, the same position may be touched, of course. Since the endpoint flag is "1" (by the above-described step S33) at this moment, the CPU 8 sets the effect flag ("1") (step S25). As a result, since the effect flag is "1" with the RUN flag being "0" (by the initialization of step S1), the CPU 8 terminates the starting point/endpoint setting process (step S26→4S27→return). Then, if the CPU 8 refreshes the display screen (step S7 of FIG. 5), a new starting point SP' (not shown) is displayed at the position which is different from the canceled starting point SP on the coordinate plane 33*e*, with a line segment LS" (with small pieces of "●") connecting between the starting point SP' and the endpoint EP being displayed.

In the case (35*b*), although the CPU 8 performs the same steps as the case (35*a*) until the judgment of step S27, the judgment of step S27 results in the RUN flag being "1". Therefore, the CPU 8 judges whether or not the current position (Cx, Cy) is the initial value (-, -) (step S28). More specifically, the judgment that the current position (Cx, Cy) is the initial value indicates a case where the effect flag has been reset during reproduction of musical piece data so that the current position (Cx, Cy) is initialized (see later-described step S17 of FIG. 5). If it is judged at step S28 that the current position (Cx, Cy) is the initial value, the CPU 8 stores the starting point position (Sx, Sy) in the current position (Cx, Cy) (step S29), sets the current position update flag ("1") (step S31), and then terminates the starting point/endpoint setting process (return). If it is judged at step S28 that the current position (Cx, Cy) is not the initial value, the CPU 8 updates the current position (Cx, Cy) in accordance with the previous position (Px, Py), the starting point position (Sx, Sy) and the endpoint position (Ex, Ey) (step S30), sets the current position update flag ("1") (step S31), and then terminates the starting point/endpoint setting process (return). Then, if the CPU 8 refreshes the display screen (step S7 of FIG. 5), a large piece of "●" representative of the current position CP is displayed at the position of the starting point SP' if the current position (Cx, Cy) is the initial value in a case where the line segment LS" is displayed on the coordinate plane 33*e*. If the current position (Cx, Cy) is not the initial value, a large piece of "●" representative of the updated current position CP is displayed at a position having the same positional relationship as the positional relationship between the current position before the update and the previous position on the line segment LS".

In the case (36*a*), since a point which is different from the starting point position (Sx, Sy) was touched on the coordinate plane 33*e* in a state where the endpoint position (Ex, Ey) has been canceled, the user's input operation is detected in a state where the endpoint flag is "0" (by the above-described step S37). Therefore, the CPU 8 stores the coordinate detected at the input operation in the endpoint position (Ex, Ey), and sets the endpoint flag ("1") (step S21→S22→S32→33). Although this embodiment is explained as that a position different from the endpoint position (Ex, Ey) whose cancel has been instructed was touched, the same position may be touched, of course. Furthermore, the CPU 8 sets the effect flag ("1") (step S25). As a result, since the effect flag is "1" with the RUN flag being "0" (by the initialization of step S1), the CPU 8 terminates the starting point/endpoint setting process (step S26→S27→return). Then, if the CPU 8 refreshes the display screen (step S7 of FIG. 5), a new endpoint EP' is displayed at a position which is different from the canceled endpoint EP on the coordinate plane 33*e*, with a line segment LS' (with small pieces of "●") connecting between the endpoint EP' and the starting point SP being displayed. The line segment LS' shown in FIG. 4 is not the line segment LS' of the case (36*a*), but is the line segment LS' obtained when the display screen is refreshed in the case (36*b*). However, if the position of the endpoint EP' is touched in a state where the endpoint EP has been canceled, a line segment similar to the line segment LS' of FIG. 4 is to be displayed on the coordinate plane 33*e*. In this case, however, a large piece of "●" representative of the current position CP' will not be displayed, but only small pieces of "●" representative of timing at which sound effect data is generated are displayed.

In the case (36*b*), although the CPU 8 performs the same steps as the case (36*a*) until the judgment of step S27, the judgment of step S27 results in the RUN flag being "1". Therefore, the CPU 8 proceeds to step S28. Since the steps from step S28 to return have been already explained in detail in the above case (35*b*), the explanation about these steps will not be repeated here. Then, if the CPU 8 refreshes the display screen (step S7 of FIG. 5), a large piece of "●" representative of the current position CP' is displayed at the position of the starting point SP if the current position (Cx, Cy) is the initial value in a case where the line segment LS' is displayed on the coordinate plane 33*e*. If the current position (Cx, Cy) is not the initial value, a large piece of "●" representative of the updated current position CP' is displayed at a position having the same positional relationship as the positional relationship between the current position before the update and the previous position on the line segment LS'. However, the current position CP' on the line segment LS' indicates a state in which the current position CP' has advanced toward the endpoint EP' by a small piece of "●" with respect to the current position CP on the line segment LS. In other words, the line segment LS' indicates not a state where only the endpoint EP of the line segment LS has been changed to the endpoint EP' but a state where the endpoint has been changed to the endpoint EP' when time has elapsed by a small piece of "●".

In the case (37*a*), since the operation of moving the starting point position (Sx, Sy) (for example, moving the starting point position to a different position and stopping the starting point position at the position while keeping touching the starting point SP on the coordinate plane 33*e*) was done, the CPU 8 updates the starting point position (Sx, Sy) to the destination position (step S21→S34→S38→S39→S40). If the endpoint position (Ex, Ey) is the initial value (-, -) at this moment, the CPU 8 terminates the starting point/endpoint setting process (step S41→return). If the endpoint position (Ex, Ey) is not the initial value (-, -), the CPU 8 judges whether the RUN flag is "1" or not (step S42). In this case (37*a*), since the RUN flag is "0", the CPU 8 terminates the starting point/endpoint setting process (step S42→return). Then, if the CPU 8 refreshes the display screen (step S7 of FIG. 5), the starting point SP is moved to the destination point SP' (not shown) on the coordinate plane 33*e*. On this occasion, there can be a case where the endpoint position (Ex, Ey) is the initial value (-, -) and a case where the endpoint is not the initial value (-, -). In the former case, only the starting point position (Sx, Sy) has been input on the coordinate plane 33*e* without the endpoint position (Ex, Ey) being input yet. In the former case, therefore, only the starting point SP is moved to the destination point SP'. In the latter case, however, since both the starting point position (Sx, Sy) and the endpoint position (Ex, Ey) have been input on the coordinate plane 33*e*, the starting point SP is moved to the destination point SP', so that the destination point SP' is defined as a new starting point SP', with a line segment (similar to the above-described line segment LS") which connects between the starting point SP' and the endpoint EP being formed and displayed.

In the case (37*b*), although the CPU 8 performs the same steps as the case (37*a*) until the judgment of step S42, the judgment of step S42 results in the RUN flag being "1". Therefore, the CPU 8 updates the current position (Cx, Cy) in accordance with the previous position (Px, Py), the starting point position (Sx, Sy) and the endpoint position (Ex, Ey) (step S43), sets the current position update flag ("1") (step S44), and then terminates the starting point/ endpoint setting process (return). Since steps S43 and S44 are similar to the above-described steps S30 and S31, respectively, steps S43 and S44 will not be explained again. Then, if the CPU 8 refreshes the display screen (step S7 of FIG. 5), a large piece of "●" representative of the updated current position CP" is displayed at a position having the same positional relationship as the positional relationship between the current position before the update and the previous position on the line segment LS" because the endpoint position (Ex, Ey) is not the initial value in a case where the line segment LS" is displayed on the coordinate plane 33*e*.

In the case (38*a*), since the operation of moving the endpoint position (Ex, Ey) (the moving operation is similar to the operation of moving the starting point SP) was done, the CPU 8 updates the endpoint position (Ex, Ey) to the destination position (step S21→S34→S38→S39→S45). Then, the CPU 8 judges whether or not the RUN flag is "1" (step S42). In this case (38*a*), since the RUN flag is "0", the CPU 8 terminates the starting point/endpoint setting process (step S42→return). Then, if the CPU 8 refreshes the display screen (step S7 of FIG. 5), the endpoint EP is moved to the destination point EP' on the coordinate plane 33*e*. Since both the starting point position (Sx, Sy) and the endpoint position (Ex, Ey) have been input on the coordinate plane 33*e*, the endpoint EP is moved to the destination point EP', so that the destination point EP' is defined as a new endpoint EP', with a line segment LS' which connects between the endpoint EP' and the starting point SP being formed and displayed.

In the case (38*b*), although the CPU 8 performs the same steps as the case (38*a*) until the judgment of step S42, the judgment of step S42 results in the RUN flag being "1". Therefore, the CPU 8 proceeds to step S43. Since the steps from step S43 to return have been already explained in detail in the above case (37*b*), the explanation about these steps will not be repeated here. Then, if the CPU 8 refreshes the display screen (step S7 of FIG. 5), a large piece of "●" representative of the updated current position CP' is displayed at a position having the same positional relationship as the positional relationship between the current position before the update and the previous position on the line segment LS' in a case where the line segment LS' is displayed on the coordinate plane 33*e*.

The starting point/endpoint setting process is designed without consideration of a case where both the starting point position (Sx, Sy) and the endpoint position (Ex, Ey) are concurrently instructed to move while musical piece is not being reproduced or is being reproduced. With consideration of this case, however, in order to make the apparatus operate properly, a judgment "whether both the starting point and the endpoint are concurrently instructed to move" is inserted between step S38 and step S39 of FIG. 6B, for example. If no, the CPU 8 proceeds to step S39. If yes, the CPU 8 carries out "update of the starting point position and the endpoint position to their respective destination points", and then proceeds to step S42.

Figure 7:
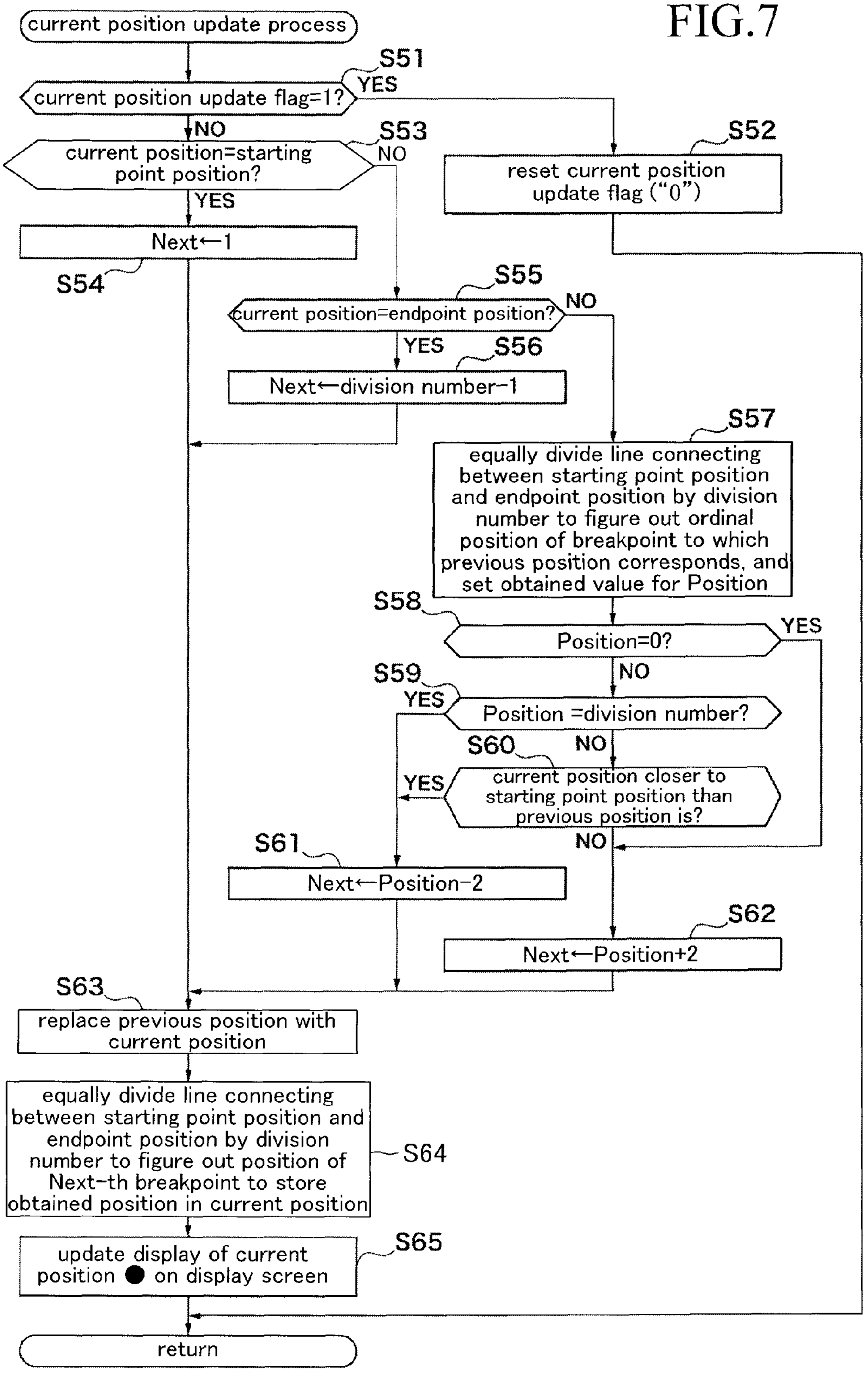
FIG. 7 is a flowchart indicative of detailed procedures of a current position update process included in FIG. 5.

Again, FIG. 5 will be explained. As described above, the current position update process (4) is started at each arrival at the sound effect data generation timing to update the current position (Cx, Cy). FIG. 7 is a flowchart indicative of detailed procedures of the current position update process (4). More specifically, the current position update process is mainly composed of the following processes (41) to (43):

(41) an update process executed when the current position is situated at the starting point position (steps S54, and S63 to S65);

(42) an update process executed when the current position is situated at the endpoint position (steps S56, and S63 to S65); and (43) an update process executed when the current position is not situated at the starting point position nor the endpoint position (steps S57 to S65). There can be cases where the current position has been already updated before the start of the current position update process (that is, cases where the current position update flag has been set). In such cases, it is unnecessary to update the current position by the current position update process. Therefore, the current position update process is designed such that if the current position update flag is "1", the CPU 8 only resets the current position update flag (step S52), and substantially avoids the current position update process. Hereafter, the current position update process will be explained, assuming that the current position update flag is "0".

If the current position (Cx, Cy) is the starting point position (Sx, Sy), the CPU 8 proceeds to the update process (41) (step S53→54). The case where the current position (Cx, Cy) is the starting point position (Sx, Sy) includes not only a case where a subsequent sound effect data generation timing has been hit after the instructions to start reproducing musical piece data had been made, with the current position (Cx, Cy) being defined as the starting point position (Sx, Sy), but also a case where the current position (Cx, Cy) has reached the endpoint position (Ex, Ey) and has returned to the current position (Cx, Cy) again during reproduction of musical piece data.

In the update process (41), the CPU 8 first sets "1" for an area Next allocated on the RAM 10 in order to indicate the ordinal position of the breakpoint to which the next current position which is to be updated corresponds (step S54).

Next, the CPU 8 replaces the previous position (Px, Py) with the current position (Cx,Cy) (step S63), and equally divides a line connecting between the starting point position (Sx, Sy) and the endpoint position (Ex, Ey) by the division number to figure out the position of the Next-th breakpoint to store the obtained position in the current position (Cx, Cy) (step S64). At the updated current position (Cx, Cy) on the display screen, furthermore, the CPU 8 displays a large piece of "●" which has been displayed on the current position before updating to refresh the piece of "●" representative of the current position (step S65).

For instance, if the current position update process is executed in a state where the line segment LS is displayed on the coordinate plane 33*e* with the current position CP being located at the position of the starting point SP, the current position CP is to be moved to the position of a small piece of "●" located on the immediate right of the starting point SP.

If the current position (Cx, Cy) is the endpoint position (Ex, Ey), the CPU 8 proceeds to the update process (42) (step S53→S55→S56). The case where the current position (Cx, Cy) is the endpoint position (Ex, Ey) indicates a case where the current position (Cx, Cy) has moved from the starting point position (Sx, Sy) to the endpoint position (Ex, Ey) during reproduction of musical piece data.

In the update process (42), the CPU 8 first sets "division number −1" for the area Next (step S56), and then proceeds to step S63. Since steps from S63 to return have been already explained in the above-described update process (41), the explanation about these steps will not be repeated.

For instance, if the current position update process is executed in a state where the line segment LS is displayed on the coordinate plane 33*e* with the current position CP being located at the position of the endpoint EP, the current position CP is moved to the position of a small piece of "●" located on the immediate left of the endpoint EP.

Furthermore, if the current position (Cx, Cy) is not the starting point position (Sx, Sy) nor the endpoint position (Ex, Ey), the CPU 8 proceeds to the update process (43) (step S53→S55→S57).

In the update process (43), the CPU 8 figures out the ordinal position of the breakpoint to which the previous position (Px, Py) corresponds when the line connecting between the starting point position (Sx, Sy) and the endpoint position (Ex, Ey) is equally divided by the division number, and then sets the obtained value for an area Position allocated on the RAM 10 (step S57). Then, the CPU 8 performs any one of the following processes (431) to (433), depending on a value set for the area Position.

(431) In a case where Position is "0" (that is, if the previous position (Px, Py) is the starting point position (Sx, Sy)), the CPU 8 sets a calculation result of "Position+2" for the area Next (step S58→S62), and then proceeds to step S63.

(432) In a case where Position is the division number (that is, if the previous position (Px, Py) is the endpoint position (Ex, Ey)), the CPU 8 sets a calculation result of "Position−2" for the area Next (step S58→S59→S61), and then proceeds to step S63.

(433) In a case where Position is not 0 nor the division number, the CPU 8 carries out either of the following processes (433*a*) and (433*b*).

(433*a*) If the current position (Cx, Cy) is closer to the endpoint position (Ex, Ey) than the previous position (Px, Py) is (that is, if the previous position (Px, Py) is situated on the left of the current position (Cx, Cy), in other words, furthermore, if the current position (Cx, Cy) is moving from the starting point position (Sx, Sy) toward the endpoint position (Ex, Ey)), the CPU 8 carries out a process which is similar to the above-described process (431).

(433*b*) If the current position (Cx, Cy) is closer to the starting point position (Sx, Sy) than the previous position (Px, Py) is (that is, if the previous position (Px, Py) is situated on the right of the current position (Cx, Cy), in other words, furthermore, if the current position (Cx, Cy) is moving from the endpoint position (Ex, Ey) toward the starting point position (Sx, Sy)), the CPU 8 carries out a process which is similar to the above-described process (432).

Since the steps from step S63 to return have been already explained in detail in the above-described update process (41), the explanation about the steps will not be repeated here.

For example, if the current position update process is carried out in a state where the line segment LS is displayed on the coordinate plane 33*e* where the current position CP is located at a position where Next is 3 as indicated in FIG. 4, with the current position CP moving toward the endpoint EP, the current position CP moves to a position of a small piece of "●" located on the immediate right of the current position CP. If the current position update process is carried out in a state which is similar to the above-described state but where the current position CP is moving toward the starting point position SP, the current position CP moves to a position of a small piece of "●" located on the immediate left of the current position CP.

Again, FIG. 5 will be explained. As described above, the sound effect generation process (5) is started after termination of the update process (41) at each arrival at sound effect data generation timing to generate sound effect data to supply the generated data to the effect circuit 15.

Figure 8:
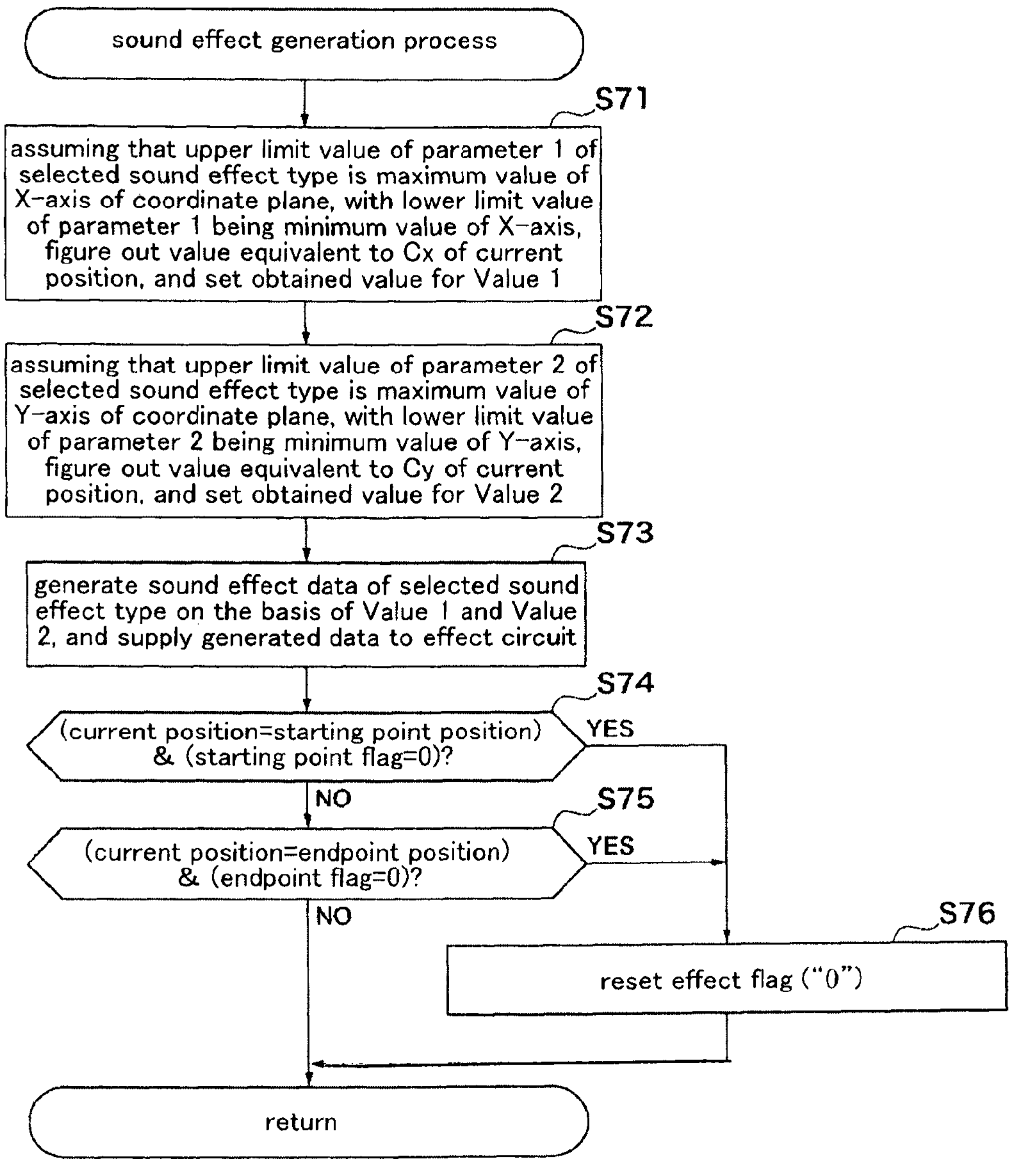
FIG. 8 is a flowchart indicative of detailed procedures of a sound effect generation process included in FIG. 5.

FIG. 8 is a flowchart indicative of detailed procedures of the sound effect generation process (5). As indicated in FIG. 8, the CPU 8 figures out a value (parameter value) equivalent to the X-coordinate "Cx" of the current position (Cx, Cy), assuming that the upper limit value of the parameter 1 of the selected sound effect type is the maximum value of the X-axis of the coordinate plane 33*e*, with the lower limit value of the parameter 1 being the minimum value of the X-axis. Then, the CPU 8 sets the obtained value for an area "Value 1" provided on the RAM 10 (step S71).

Then, the CPU 8 figures out a value (parameter value) equivalent to the Y-coordinate "Cy" of the current position (Cx, Cy), assuming that the upper limit value of the parameter 2 of the selected sound effect type is the maximum value of the Y-axis of the coordinate plane 33*e*, with the lower limit value of the parameter 2 being the minimum value of the Y-axis. Then, the CPU 8 sets the obtained value for an area "Value 2" provided on the RAM 10 (step S72).

In this embodiment, since the current position moves along a segment line connecting between the starting point position and the endpoint position, respective upper limit values and lower limit values of the target parameters (the parameters 1 and 2, in this embodiment) are determined according to the starting point position and the endpoint position.

Furthermore, the CPU 8 generates sound effect data of the selected sound effect type on the basis of the respective parameter values set for the areas Value 1 and Value 2, and supplies the generated data to the effect circuit 15 (step S73). The sound effect data generated at this step has to have a form which suits the configuration of the effect circuit to which the generated data is supplied. As described above, the effect circuit 15 employed in the sound effect data generating apparatus of this embodiment has the registers for storing parameter values for sound effect parameters so as to add an appropriate effect to musical tone signals in accordance with parameter values stored in the registers. More specifically, sound effect data to be supplied to the effect circuit 15 can be sound effect parameters themselves having determined parameter values, and need not to be generated (or converted) newly in accordance with the sound effect parameters. However, there can be an effect circuit of a type which does not directly accept sound effect parameters. Therefore, step S73 is designed to generate sound effect data on the basis of sound effect parameters having determined parameter values.

Next, the CPU 8 carries out any of the following processes (51) to (53), depending on situation.

(51) If the current position (Cx, Cy) is the starting point position (Sx, Sy), with the starting point flag being "0" (for example, in a case where, on the line segment LS which is displayed on the coordinate plane 33*e* and whose starting point SP being canceled, the current position CP has reached the starting point SP), the CPU 8 resets the effect flag (step S74→S76), and then terminates the sound effect generation process (return).

(52) If the current position (Cx, Cy) is the endpoint position (Ex, Ey), with the endpoint flag being "0" (for example, in a case where on the line segment LS which is displayed on the coordinate plane 33*e* and whose endpoint EP being canceled, the current position CP has reached the endpoint EP), the CPU 8 resets the effect flag (step S74→S75→S76), and then terminates the sound effect generation process (return).

(53) In a case which is neither the case (51) nor the case (52), the CPU 8 terminates the sound effect generation process (step S74→S75→return).

Hereafter, FIG. 5 will be explained again. The above-described sound effect reset process (6) is a process for resetting sound effect when the effect flag was reset during reproduction of musical piece data (RUN="1") (see steps S74 to S76 of FIG. 8), more specifically, when "when arriving at canceled return point (starting point/endpoint)" is set for "effect end timing" (see FIG. 3). For example, the sound effect reset process (6) is carried out to reset a sound effect when the starting point SP or endpoint EP had been canceled, and the current position CP has reached the canceled starting point SP or endpoint EP in a state where the line segment LS is displayed on the coordinate plane 33*e*.

In the sound effect reset process (6), if there is a sound effect which is currently effective, the CPU 8 outputs instructions to disable the effect to the effect circuit 15 (step S16), and initializes the starting point position (Sx, Sy), the endpoint position (Ex, Ey), the previous position (Px, Py), and the current position (Cx, Cy), in other words, sets these positions at the initial value (-, -) (step S17). When the sound effect reset process (6) is terminated, the CPU 8 returns to the above-described step S5.

The reproduction termination process (7) is a process carried out, as described above, when the user instructed to terminate reproduction of musical piece data. More specifically, the reproduction termination process (7) is carried out before termination of the sound effect control process.

In the reproduction termination process (7), the CPU 8 carries out the following processes (7*a*) to (7*c*):

(7*a*) reset the RUN flag ("0") (step S9);

(7*b*) instruct the timer 11 to finish counting (step S9); and (7*c*) perform a sound canceling process (step S10).

The sound effect control process is configured such that coordinates of the coordinate plane 33*e* are always treated as positional coordinates, and are converted from the positional coordinates into parameter values of sound effect parameters finally at the stage where sound effect data is output to the effect circuit 15. Therefore, although respective coordinates on the coordinate plane 33*e* are basically supposed to be positional coordinates, values (such as SP (417 ms, 25%)) of the parameters 1 and 2 converted from positional coordinates are shown as coordinates in FIG. 4. The conversion of positional coordinates of points into parameter values which are to be actually output is done merely to help the user grasp the actual amounts of parameter values. Of course, this embodiment may be modified such that coordinates on the coordinate plane 33*e* are converted into values of the parameters 1 and 2 at the point in time when the parameters 1 and 2 are assigned to the X-axis and the Y-axis of the coordinate plane 33*e*, respectively. In this modification, since the number of positions desired to convert into values of the parameters 1 and 2 is small such as the starting point position (Sx, Sy), the endpoint position (Ex, Ey) and the current position (Cx, Cy), only the necessary positions may be converted into values of the parameters 1 and 2.

In the sound effect control process, furthermore, the tempo is to be set in the start process (1), and cannot be changed later on. In order to change the tempo, therefore, it is necessary to terminate the sound effect control process to start the sound effect control process again to set a tempo in the start process (1). This is because, the sound effect control process is designed such for simplicity of the sound effect control process. However, a process for changing tempo may be inserted into the sound effect control process so that the user can change tempo at some point in the process.

In the sound effect control process, furthermore, consideration is given only to a case where "when arriving at canceled return point (starting point/endpoint)" is selected as "effect end timing", but any consideration is not given to a case where "when being instructed to stop (including the time when both the starting point and the endpoint are canceled)" or "when a predetermined period of time (such as one minute) has elapsed after start of effect" is selected. However, these cases may be considered. For a case where the former timing is selected, therefore, it is preferable to insert a judgment "whether the starting point flag is "0", with the endpoint flag being "0"" between step S75 and "return" of FIG. 8. If yes, the CPU 8 is to proceed to step S76. If no, the CPU 8 is to proceed to "return". For a case where the latter timing is selected, furthermore, it is preferable to insert a judgment "whether the effect flag has been changed from "0" to "1" between step S12 and step S13 of FIG. 5. If yes, the CPU 8 is to execute "instructing the timer 11 to start counting a predetermine period of time" before proceeding to step S13. If no, the CPU 8 is to directly proceed to step S13. Between step S75 and "return" of FIG. 8, furthermore, it is preferable to insert a judgment "whether the timer 11 has finished counting the predetermined period of time". If yes, the CPU 8 is to proceed to step S76. If no, the CPU 8 is to proceed to "return".

In this embodiment, furthermore, line templates of different patterns are provided as options for "type of line connecting between starting point and endpoint" as indicated in FIG. 3 so that the user can select any of the options. However, the embodiment may be modified such that a line drawn by the user when the user inputs the starting point and the endpoint on the coordinate plane 33*e* is stored so as to use the line. Alternatively, the embodiment may be modified such that the user is prompted to input three or more points so as to define not only a starting point and an endpoint but also a pass point to control to pass through the pass point when sound effect data is generated.

Furthermore, options for "effect end timing" may include not only those indicated in FIG. 3 but also "when a predetermined number of round trips between two points (not necessarily the starting point and the endpoint) have been made", "when a predetermined period of time (e.g., one minute) has passed since the last input had been made (no changes of the input had been detected", "effect will be maintained while the user is touching two points, but effect will be immediately end when the user stops touching the two points", and "if there is only a point that the user remains touching, parameter values will change to the point to end effect". Furthermore, a button (realized by software) or an operating element (realized by hardware) for instructing to end effect may be provided so that effect can be ended in accordance with user's operation of the button or the operating element.

In this embodiment, furthermore, positional information is indicated by two-dimensional values represented by XY coordinates, so that two kinds of parameters can be controlled. However, since the touch panel 3 can detect pressure as well, the embodiment may be modified to include pressure in the positional information to employ three-dimensional values so that three kinds of parameters can be controlled. Conversely, the positional information may be dealt as one-dimensional value so that one kind of parameter can be controlled.

Although the XY coordinates can most easily represent the information about the starting point and the endpoint, the information may be represented by a combination of ratio such as %. In this case, by defining the left end/right end of the coordinate plane 33*e* as the lower limit value/upper limit value of a parameter, and defining the upper end/lower end of the coordinate plane 33*e* as the upper limit value/lower limit value of a different parameter, pieces of positional information of the starting point and the endpoint may be associated with the parameter values. For example, in a case where "a position between a smaller one and a greater one in proportions of 7:3" is designated for a parameter having a range from 0 to 10, a value "7" can be assigned to the parameter. Furthermore, in a case where a value which can range from 0 to 1000 can be designated as positional information, it is preferable to define "0" as the lower limit value of a corresponding parameter and "1000" as the upper limit value of the parameter so that a value of the parameter can be figured out in accordance with a value that the user actually designates. In a case where a parameter value can be both positive and negative, it is preferable that an intermediate value of possible values as positional information is defined as "0". Furthermore, any modification can be employed as long as values (amounts) can be converted into values of a corresponding parameter.

In this embodiment, the touch panel 3 is employed to be used both for user's input operation and for display. However, user's input operation and display may be done by separate devices. Such as a notebook PC, for instance, inputting of positional information may be done on a pad, with the input positional information being displayed on an LCD (liquid crystal display). In a case where an electronic musical instrument is provided with a pad serving as an input operating element, the display can be omitted. In this case, since a display screen of the pad can be small, respective ranges of parameter values (of two kinds) indicative of effective effect may be indicated by characters or numeric values instead of displaying positions and paths on a coordinate plane.

Furthermore, although this embodiment is designed such that a sound effect which varies in synchronization with the tempo of a reproduced musical piece is added to musical tone signals, the target which is to be reproduced may not be a musical piece but may be rhythm. In this embodiment, in addition, although a plurality of options (e.g., every bar, every two beats, every beat, every quarter note, every eighth note, etc.) are provided as intervals at which a sound effect is varied, those options are fixed values. However, this embodiment may be modified to allow the user to specify a user's desired value. Alternatively, the interval at which a sound effect is varied may be specified according to tempo level. Irrespective of tempo, furthermore, a default interval may be provided so that the user can adjust the interval.

The types of sound effect and the types of sound effect parameter employed in this embodiment are mere examples, and any types can be employed. In addition, the manner by which the user specifies a type of sound effect and types of sound effect parameter is also a mere example, and any manner can be employed as long as the manner allows the user to change the types.

Furthermore, this embodiment is configured such that as for inputting of the starting point and the endpoint on the coordinate plane 33*e*, a point input earlier is defined as the starting point, and a point input later is defined as the endpoint. However, the starting point and the endpoint may be defined inversely. Furthermore, this embodiment may be modified to allow the user to change the range of effect parameter value by moving either the starting point or the endpoint while holding the other point on the coordinate plane 33*e*. Furthermore, this embodiment may be modified to allow the user to seamlessly vary an effect while keeping changing the range of parameter value by user's operation of sliding the starting point and the endpoint on the coordinate plane 33*e*.

This embodiment may be modified such that in a case where the starting point and the endpoint are displayed on the screen, the starting point and the endpoint are effective while the user keeps touching the starting point and the endpoint. Furthermore, this embodiment may be modified to provide respective cancel buttons for the starting point and the endpoint near respective display areas so that the starting point and the endpoint will be effective until the corresponding cancel buttons are depressed even if the user has moved the user's fingers off the touch panel after touching the starting point and the endpoint. Alternatively, this embodiment may be modified such that even if the user has moved the fingers off the touch panel after touching the touch panel to input the starting point and the endpoint, the starting point and the endpoint are still effective, but will be canceled by a user's predetermined operation such as drawing a small circle or double-clicking on the starting point or the endpoint which the user desires to cancel.

Furthermore, this embodiment is designed to display a line (a dashed line) connecting between the endpoint and the starting point, and small pieces of "●" indicative of timing at which musical effect data is reproduced on the coordinate plane 33*e* as indicated in FIG. 4. However, this embodiment may be modified to display only a big piece of "●", without displaying the line and the small pieces of "●", for the line and the small pieces of "●" are not necessary as long as the user can recognize the current position.

Although sound effect data is generated in synchronization with tempo of a reproduced musical piece or rhythm, generation of sound effect data may be started at the starting point concurrently with the start of reproduction of a musical piece or rhythm, or may be started at the starting point in synchronization with the beginning of a bar situated immediately after the instructions to start the reproduction. Furthermore, the embodiment may be modified to allow the user to specify the position of a bar at which generation of sound effect data is started. Furthermore, generation of sound effect data may be started at the starting point at a point in time when the user has finished inputting the starting point and the endpoint on the touch panel assuming that there exists effective tempo information (even default) regardless of whether a musical piece or rhythm is being reproduced or not. Furthermore, generation of sound effect data may be started at some position (at the midpoint or the like) of the line connecting between the starting point and the endpoint.

In this embodiment, furthermore, the line connecting between the starting point and the endpoint is divided into equally-spaced intervals. However, this embodiment may be modified to define unevenly-spaced positions such as starting at the starting point to proceed by $1/8 \rightarrow 3/8 \rightarrow 1/8 \rightarrow 1/4 \rightarrow 1/8$ of the line to return from the endpoint when reaching the endpoint.

It is needless to say that the object of the present invention can be also achieved by supplying a storage medium storing program codes of software which realizes functions of the above-described embodiment to a system or an apparatus to allow a computer (or, CPU or MPU) of the system or the apparatus to read out and execute the program codes stored in the storage medium.

In this case, the program codes themselves read out from the storage medium are to realize the novel functions of the present invention, while the program codes and the storage medium which stores the program codes are to compose the present invention.

As the storage medium for supplying the program codes, a flexible disk, hard disk, magneto optical disk, CD-ROM, CD-R, CD-RW, DVD-ROM, DVD-RAM, DVD-RW, DVD+RW, magnetic tape, nonvolatile memory card, ROM or the like can be used. Alternatively, the program codes may be supplied from a server computer via a communications network.

Furthermore, it is needless to say that there can be a case where the functions of the above-described embodiment are realized not only by the computer executing the read program code, but also by an OS operating on the computer to actually perform a part of or the entire processing in accordance with instructions made by the program codes.

Furthermore, it is needless to say that there can be a case where the functions of the above-described embodiment are realized by reading out the program codes from the storage medium to be written into an extension board inserted into a computer or a memory of an extension unit connected to a computer so that a CPU or the like of the extension board or the extension unit can actually perform a part of or the entire processing in accordance with instructions of the program codes.

What is claimed is:

1. A sound effect data generating apparatus comprising:

a memory; and a processor configured to execute computer executable instructions recorded on the memory, the computer executable instructions including instructions, that when executed by the processor, cause the sound effect data generating apparatus to:

define a starting point having position information;

define an endpoint having position information;

display a current reproduction position of musical piece data on a line connecting between the defined starting point and the defined endpoint on a display device;

define plural points having position information and which are situated on the line connecting between the defined starting point and the defined endpoint at a timing corresponding to a reproduction tempo;

determine values of a certain parameter belonging to a certain type of sound effect on the basis of the position information of the defined plural points, the position information of the defined starting point and the position information of the defined endpoint, when the displayed current reproduction position follows the defined plural points, the defined starting point, and the defined endpoint, respectively; and generate plural sets of sound effect data in accordance with the determined parameter values.

2. The sound effect data generating apparatus according to claim 1, wherein a point situated on the line connecting between the defined starting point and the defined endpoint is defined as a plural point at each arrival at timing corresponding to the reproduction tempo of a series of tone signals.

3. The sound effect data generating apparatus according to claim 2, wherein the computer executable instructions further include instructions, that when executed by the processor, cause the sound effect data generating apparatus to:

set a time length for the entire line connecting between the defined starting point and the defined endpoint; and set a time interval between arrivals of timing corresponding to the reproduction tempo, wherein a point situated on the line is defined as a plural point in accordance with the set time length for the entire line and the set time interval.

4. The sound effect data generating apparatus according to claim 3, wherein a multiple of a predetermined note length is set as the time length, or the time length is set on a bar basis.

5. The sound effect data generating apparatus according to claim 3, wherein the time interval is set on a predetermined note length basis.

6. The sound effect data generating apparatus according to claim 2, wherein in a state where the defined starting point and the defined endpoint are effective, sound effect data is continuously generated while the current reproduction position travels from the defined starting point toward the defined endpoint along the defined plural points, travels from the defined endpoint toward the defined starting point after arrival at the defined endpoint, and travels from the defined starting point toward the defined endpoint again after arrival at the defined starting point.

7. The sound effect data generating apparatus according to claim 6, wherein in a state where at least either the defined starting point or the defined endpoint is no longer effective, sound effect data continues to be generated until arrival of the current reproduction position at the defined starting point or the defined endpoint situated immediately before the defined starting point or the defined endpoint which is no longer effective.

8. The sound effect data generating apparatus according to claim 1, the apparatus further comprising the display device.

9. The sound effect data generating apparatus according to claim 1, wherein the computer executable instructions further include instructions, that when executed by the processor, cause the sound effect data generating apparatus to determine an upper limit value and a lower limit value of the certain parameter according to the position information of the defined starting point and the position information of the defined endpoint.

10. The sound effect data generating apparatus according to claim 1, wherein the computer executable instructions further include instructions, that when executed by the processor, cause the sound effect data generating apparatus to:

define respective coordinate positions situated on an identical coordinate plane of two or more dimensions as the starting point and the endpoint, respectively; and determine respective values of the same number of parameters as the number of the dimensions so that a value of each parameter can be associated with a different coordinate axis, and generate the same number of sound effect data sets as the number of the dimensions in accordance with the determined parameter values.

11. The sound effect data generating apparatus according to claim 1, wherein the computer executable instructions further include instructions, that when executed by the processor, cause the sound effect data generating apparatus to define the starting point and the endpoint, respectively, in accordance with a user's touch positions on the display device, the display device being a touch panel display.

12. The sound effect data generating apparatus according to claim 1, wherein the computer executable instructions further include instructions, that when executed by the processor, cause the sound effect data generating apparatus to allow selection of the certain type of sound effect and the certain parameter by a user.

13. A non-transitory computer-readable storage medium including computer executable instructions stored thereon, wherein the computer executable instructions instruct a microprocessor to perform the following steps:

defining a starting point having position information;

defining an endpoint having position information;

displaying a current reproduction position of musical piece data on a line connecting between the defined starting point and the defined endpoint on a display device;

defining plural points having position information and which are situated on the line connecting between the defined starting point and the defined endpoint at a timing corresponding to a reproduction tempo;

determining values of a certain parameter belonging to a certain type of sound effect on the basis of the position information of the defined plural points, the position information of the defined starting point, and the position information of the defined endpoint, when the displayed current reproduction position follows the defined plural points, the defined starting point, and the defined endpoint, respectively; and generating plural sets of sound effect data in accordance with the determined parameter values.

14. The non-transitory computer-readable storage medium according to claim 13, wherein a point situated on the line connecting between the defined starting point and the defined endpoint as a plural point at each arrival at timing corresponding to the reproduction tempo of a series of tone signals.

15. The non-transitory computer-readable storage medium according to claim 14, further including computer executable instructions stored thereon, wherein the computer executable instructions instruct the microprocessor to perform the following steps:

setting a time length for the entire line connecting between the defined starting point and the defined endpoint; and setting a time interval between arrivals of timing corresponding to the reproduction tempo, wherein a point situated on the line is defined as a plural point in accordance with the set time length for the entire line and the set time interval.

16. The non-transitory computer-readable storage medium according to claim 15, wherein a multiple of a predetermined note length is set as the time length, or the time length is set on a bar basis.

17. The non-transitory computer-readable storage medium according to claim 15, wherein the time interval is set on a predetermined note length basis.

18. The non-transitory computer-readable storage medium according to claim 14, wherein in a state where the defined starting point and the defined endpoint are effective, sound effect data is continuously generated while the current reproduction position travels from the defined starting point toward the defined endpoint along the defined plural points, travels from the defined endpoint toward the defined starting point after arrival at the defined endpoint, and travels from the defined starting point toward the defined endpoint again after arrival at the defined starting point.

19. The non-transitory computer-readable storage medium according to claim 18, wherein in a state where at least either the defined starting point or the defined endpoint is no longer effective, sound effect data continues to be generated until arrival of the current reproduction position at the defined starting point or the defined endpoint situated immediately before the defined starting point or the defined endpoint which is no longer effective.

20. A sound effect data generating method comprising:

defining a starting point having position information;

defining an endpoint having position information;

displaying a current reproduction position of musical piece data on a line connecting between the defined starting point and the defined endpoint on a display device;

defining plural points having position information and which are situated on the line connecting between the defined starting point and the defined endpoint at a timing corresponding to a reproduction tempo;

determining values of a certain parameter belonging to a certain type of sound effect on the basis of the position information of the defined plural points, the position information of the defined starting point, and the position information of the defined endpoint, when the displayed current reproduction position follows the defined plural points, the defined starting point, and the defined endpoint, respectively; and generating plural sets of sound effect data in accordance with the determined parameter values.

* * * * *